United States Patent [19]
Coggio et al.

[11] Patent Number: 5,652,285
[45] Date of Patent: Jul. 29, 1997

[54] FLAME RETARDANT THERMOSETTABLE RESIN COMPOSITIONS

[75] Inventors: William D. Coggio, Woodbury; William J. Schultz, Vadnais Heights; Dennis C. Ngo, Woodbury; Robert D. Waid, Oakdale, all of Minn.; Valerie M. Juvin-Pedretti, Nevilly/Seine, France

[73] Assignee: Minnesota Mining and Manufacturing Company, St. Paul, Minn.

[21] Appl. No.: 598,664

[22] Filed: Feb. 8, 1996

Related U.S. Application Data

[63] Continuation of Ser. No. 320,070, Oct. 7, 1994, abandoned.

[51] Int. Cl.$^6$ .................................................. C08K 5/5399
[52] U.S. Cl. ........................... 524/116; 428/378; 524/452; 524/506
[58] Field of Search ................................ 524/116, 452, 524/506; 428/378

[56] References Cited

U.S. PATENT DOCUMENTS

| | | | |
|---|---|---|---|
| 3,356,769 | 12/1967 | Allock | 260/924 |
| 3,792,117 | 2/1974 | Kolodchin et al. | 524/116 |
| 3,865,783 | 2/1975 | Clutter | 260/45.9 NP |
| 3,894,120 | 7/1975 | Wolf | 524/116 |
| 3,920,616 | 11/1975 | Murch | 524/116 |
| 3,996,312 | 12/1976 | Kolich et al. | 524/116 |
| 4,029,634 | 6/1977 | Meredith | 524/116 |
| 4,079,035 | 3/1978 | Brackenridge | 524/116 |
| 4,405,738 | 9/1983 | McNeely | 524/116 |
| 4,496,685 | 1/1985 | Nagasawa et al. | 524/708 |
| 4,551,488 | 11/1985 | Leech et al. | 523/451 |
| 4,614,788 | 9/1986 | Dettloff et al. | 528/91 |
| 4,684,678 | 8/1987 | Schultz et al. | 523/466 |
| 4,928,438 | 5/1990 | Narimatsu et al. | 428/343 |
| 4,997,876 | 3/1991 | Scarso | 523/451 |
| 5,041,478 | 8/1991 | Sugawara et al. | 524/116 |
| 5,158,999 | 10/1992 | Swales et al. | 524/100 |
| 5,183,699 | 2/1993 | Takemura et al. | 428/214 |
| 5,225,643 | 7/1993 | Marchant | 340/605 |

FOREIGN PATENT DOCUMENTS

| | | |
|---|---|---|
| 2 833 910 | 2/1979 | Germany. |
| 61-120850 | 6/1986 | Japan. |
| 61-190522 | 6/1986 | Japan. |
| 61-208510 | 6/1986 | Japan. |
| 62-105453 | 5/1987 | Japan. |
| 1-207986 | 8/1989 | Japan. |
| 3-20325 | 1/1991 | Japan. |
| 6-104714 | 12/1994 | Japan. |
| 139 34 | of 1984 | Poland. |

OTHER PUBLICATIONS

Hungarian Journal of Industrial Chemistry Veszprem, *Properties of Polyethylene Terephtalate With P–Bromophenoxy-cyclophosphazene Blends*, Laszkiewicz and Kotek, vol. 17, pp. 221–227 (1989).
Engineered Material Handbook—vol. 1, Composites, 20–29, 33, 34, 71–73, 139–152, 355, 356, 399, 400 (1987)—ASM International.

*Primary Examiner*—Veronica P. Hoke
*Attorney, Agent, or Firm*—Gary L. Griswold; Walter N. Kirn

[57] ABSTRACT

The invention provides a thermosettable resin composition comprising (a) one or more thermosettable resins, (b) one or more of curatives, hardeners, and optionally catalysts for the curing of the thermosettable resin in an amount sufficient for the cure of the thermosettable resin, and (c) an effective amount of at least one non-functional cyclophosphazene to render said resin composition, when cured, flame retardant. The non-functional cyclophosphazene contains aryloxy group substitution and does not covalently bond with the resin network. As a result, the non-functional cyclophosphazene does not negatively impact key performance properties such as modulus, thermal stability, dielectric behavior, fracture toughness, moisture uptake or adhesion.

20 Claims, 1 Drawing Sheet

Viscosity versus Time for Epoxy Resin Samples Held Isothermally at 104 °C

FLAME RETARDANT THERMOSETTABLE RESIN COMPOSITIONS

This is a continuation of application Ser. No. 08/320,070 filed Oct. 7, 1994 now abandoned.

FIELD OF THE INVENTION

The present invention relates to a thermosettable resin composition that is curable to a flame retardant network.

BACKGROUND OF THE INVENTION

Thermosettable resins are well known for their use in structural adhesives, and advanced composite materials used in electronic, architectural and aerospace applications. Articles prepared from these thermosettable resins, however, have been flammable, a characteristic that has seriously limited their use.

Many materials have been suggested for addition to synthetic resins to make them flame retardant. Various considerations must be taken into account in selecting a suitable flame retardant. Since the thermosettable resin is often required to perform under adverse conditions (for example, high temperature, high humidity or high stress conditions), the flame retardant must not seriously detract from the physical properties of the resin. It is also desirable that the flame retardant be inert and not degrade under process or use conditions. Premature degradation of the flame retardant within the resin network at high temperatures, high humidities or high stresses can initiate catastrophic matrix failure. In addition, the flame retardant should not interfere with process parameters. For example, a flame retardant that caused premature cure of the resin would be highly undesirable.

Chemical flame retardants that are utilized in many traditional applications such as textile treatments, surface coatings or low performance adhesives, have numerous shortcomings when used in thermosettable resins. For example, mineral fillers such as magnesium hydroxide ($Mg(OH)_2$), aluminum trihydrate (ATH), and poly(ammonium phosphate) are often used successfully as flame retardants for paints or reinforced adhesives. Such particulate flame retardants, however, are inadequate when used in thermosettable resins intended for use at elevated temperatures. These mineral fillers often require loading levels of 25% to 40% by weight to impart sufficient flame retardant performance to the thermosettable resin. At these high loadings, the dispersed mineral filler negatively impacts critical properties such as moisture uptake, ductility and resin strength. Moreover, the incompatibility of the mineral fillers in the thermoset resins compromises processing properties such as viscosity. In addition, mineral fillers are generally not suitable for making composite materials by resin transfer molding (RTM), where a thermosettable resin is injected into a fiber network such as carbon or glass fiber. When making composite articles by RTM, the composite fibers can filter out the dispersed flame retardant or prevent a uniform distribution of the flame retardant, thereby reducing its efficiency.

Unlike the aforementioned mineral fillers, red phosphorus is a particulate flame retardant that is efficient at lower loadings. However, red phosphorus has limited use in epoxy resin networks. Attempts to disperse red phosphorus into other resins result in cured resin articles that have uneven or aesthetically unappealing particulate dispersions. Moreover, like the mineral fillers, red phosphorus may decrease the strength of the cured resin. In addition, because of its particle size, red phosphorus may be filtered out by composite fibers when used to make composite articles by RTM.

To overcome the processing and high loading problems associated with mineral fillers, several classes of melt processable chemical flame retardants have been developed. In general, these chemical flame retardants consist of alkyl or aryl phosphate esters and organohalo compounds such as brominated epoxies. Resins comprising these materials are more easily processed than those with dispersed fillers. However, flame retardant loadings of 15% to 30% by weight are typically required to achieve adequate flame retardancy, and these flame retardants tend to lack the thermal and hydrolytic stability required for high performance composite systems. Although certain phosphate esters have improved thermal and hydrolytic stability, these materials still tend to plasticize the resin network to such a degree that upper temperature limits for article use are lowered. Organohalo compounds, such as decabromobiphenyl, typically exhibit higher moisture stability, but lack thermal stability. Moreover, when burned, the organohalo compounds release toxic and corrosive hydrohalogen gases. As a consequence, the use of halogen compounds is coming under increasing scrutiny because of environmental and health concerns. The teachings of Yoshioka in GB patent 1,487,632 further corroborates these points and addresses these issues by use of functional arylphosphate-phenylamides. Further discussion on conventional flame retardants can be found in the *Handbook of Organophosphorus Chemistry*, Engel, R., Chapter 14 by Marcel Dekker, (1992); the article of J. Green in the *Journal of Fire Science*, Volume 10, page 471 (1992); and the article by Fritz et. al. in the *Angewandt Makromolekular Chemie*, Volume 198, page 51 (1992).

Phosphonitrilic or phosphazene compounds have also been disclosed as an additive to synthetic resins, including thermosetting materials, to make them flame retardant. For the most part, these phosphazene compounds have been substituted by a functional group which enables the compound to react with the synthetic resin and become covalently bonded to the resin network.

In general, however, the incorporation of a functional phosphazene into a resin causes the resin network to be susceptible to thermal or hydrolytic degradation. Another major drawback is that the functional materials tend to negatively impact processing parameters, for example, resin viscosity and resin pot life.

The use of non-functional group-substituted cyclophosphazenes as flame retardants is also known for specific applications. For example, U.S. Pat. No. 3,865,783 describes the use of hexaphenoxycyclotriphosphazene as a flame retardant for polyesters that are to be used for melt spinning of fibers. U.S. Pat. No. 4,405,738 describes the use of cyclotri (or tetra) phosphazenes as flame retardant additives for polyesters to be used for melt spinning of fibers. U.S. Pat. No. 4,496,685 discloses an adhesive composition comprising an alpha-cyanoacrylate monomer and a phosphazene compound, including phenoxyphosphazene as a UV stabilizer. Japan Kokai No. 61/120850A discloses an epoxy resin composition used to seal semiconductors and other electronic circuit parts. The composition includes specific phosphazene compounds to reduce stresses due to thermal expansion occurring during cure of the epoxy resin, without sacrificing other properties, such as moisture resistance. A general discussion of the use of phosphazenes in heat resistant crosslinked matrix polymers, flame and heat resistant hydraulic fluids and lubricants, and chemosterilant insecticides can be found in the Apr. 22, 1968 issue of *Chemical and Engineering News* at pages 66–81.

It is also known that two or more types of flame retardants may be combined in a single system to give antagonistic, synergistic or additive effects (*Encyclopedia of Polymer Science and Engineering*, Volume 7, p. 182 (1987)). Antagonistic effects result when the different classes of flame retardants are less effective than expected from an additive model. Synergy exists when the combination of two or more flame retardant additives improves flame retardancy beyond what would be expected from a simple additive model. A well-known example of true synergy is found in the combination of antimony oxides with halogenated materials. True synergism is relatively rare (for a further discussion of synergy, see *Flame Retardancy of Polymeric Materials*, W. C. Kuryla, A. J. Papa, Volume 4, page 109 (1978)). Most commonly, two different types of flame retardants may show improved performance in an additive fashion.

For example, phosphorus-containing flame retardants have shown synergistic performance when combined with nitrogen-containing materials in cellulosic polymers. In other types of polymers, the efficiency of phosphorus-based flame retardants has been influenced by the overall ratio of phosphorus atoms to nitrogen atoms. Examples of materials which combine phosphorus and nitrogen sources for enhanced flame retardant performance are common in the art; in particular, these types of materials are often combined to produce intumescent compounds, which outgas during combustion to produce a physical flame retardant barrier of adherent char. Such materials are described in U.S. Pat. No. 5,182,388, wherein thermoplastic polymers are made flame retardant by the addition of derivatives of 2,4,6-triamino-1,3,5-triazine salified by the partial salt of an oxyacid of phosphorus. A polymer consisting of alternating derivatized phosphine oxide and 1,3,5-triazine repeating units is described in U.S. Pat. No. 5,158,999, also for imparting flame retardant properties to a thermoplastic but without intumescence.

It becomes apparent from the above discussion that there is critical need to develop a flame retardant additive for advanced composite materials that will provide flame retardancy without loss of performance properties. To date, no one flame retardant additive has been identified that can provide adequate flame retardant performance and ease of processing with minimal impact on composite properties.

SUMMARY OF THE INVENTION

The present invention provides a thermosettable resin composition that is processable by conventional techniques and curable to a composition having excellent flame retardancy while retaining thermal and hydrolytic stability and acceptable mechanical properties. The composition contains one or more thermosettable resins, one or more curatives, hardeners, and optionally catalysts, and an effective amount of one or more non-functional cyclophosphazenes. Preferably, the thermosettable resin composition comprises:

a) one or more thermosettable resins, b) one or more of curatives, hardeners, and optionally catalysts for the curing of the thermosettable resin in an amount sufficient for the cure of the thermosettable resin, and c) an effective amount of at least one non-functional cyclophosphazene to render said resin composition, when cured, flame retardant, wherein said non-functional cyclophosphazene contains aryloxy group substitution.

The present invention also provides a method of rendering a thermosettable composition flame retardant comprising the steps of providing and mixing the components (a), (b) and (c) described above and curing the mixture to a flame retardant resin.

As used herein, the terms "flame retardant" and "non-functional" are defined as follows:

The term "flame retardant" as used herein means that the compositions of the present invention, when cured, are more burn resistant than identical compositions made without flame retardant. Examples 11, 12 and 21 describe burn test procedures that are useful in determining flame retardancy. In practice, the test for flame retardancy is dictated by the requirements of a particular application or, in some cases, a regulatory agency. A number of tests are known for determining the flame retardancy of materials. For example, the Oxygen Index, ASTM D-635 (horizontal) and U.L. 94 Tests are frequently used to evaluate flammability characteristics of polymers. Any one of these tests may be used to determine the flame retardancy of the composition of the invention. The term "non-functional" means that the cyclophosphazene does not covalently bond with the resin network.

Because the cyclophosphazene is inert to the polymerization of the resin system, it provides flame retardancy in the cured resin, without negatively affecting key performance properties such as modulus, thermal stability, dielectric behavior, fracture toughness, moisture uptake or adhesion. In addition, the cyclophosphazene does not adversely affect the processing characteristics of the resin system, for example, by causing premature cure of the resin or unacceptably increasing resin viscosity. Furthermore, the processing and compatibility or solubility characteristics of the cyclophosphazene may be tailored by controlling the nature of its substituted groups. This allows for great flexibility in designing resin systems to meet processing or performance requirements. For example, the cyclophosphazene may be tailored to have solubility characteristics that facilitate preservation of the glass transition temperature of the resin.

DETAILED DESCRIPTION OF THE INVENTION

Resin

Figure 1:
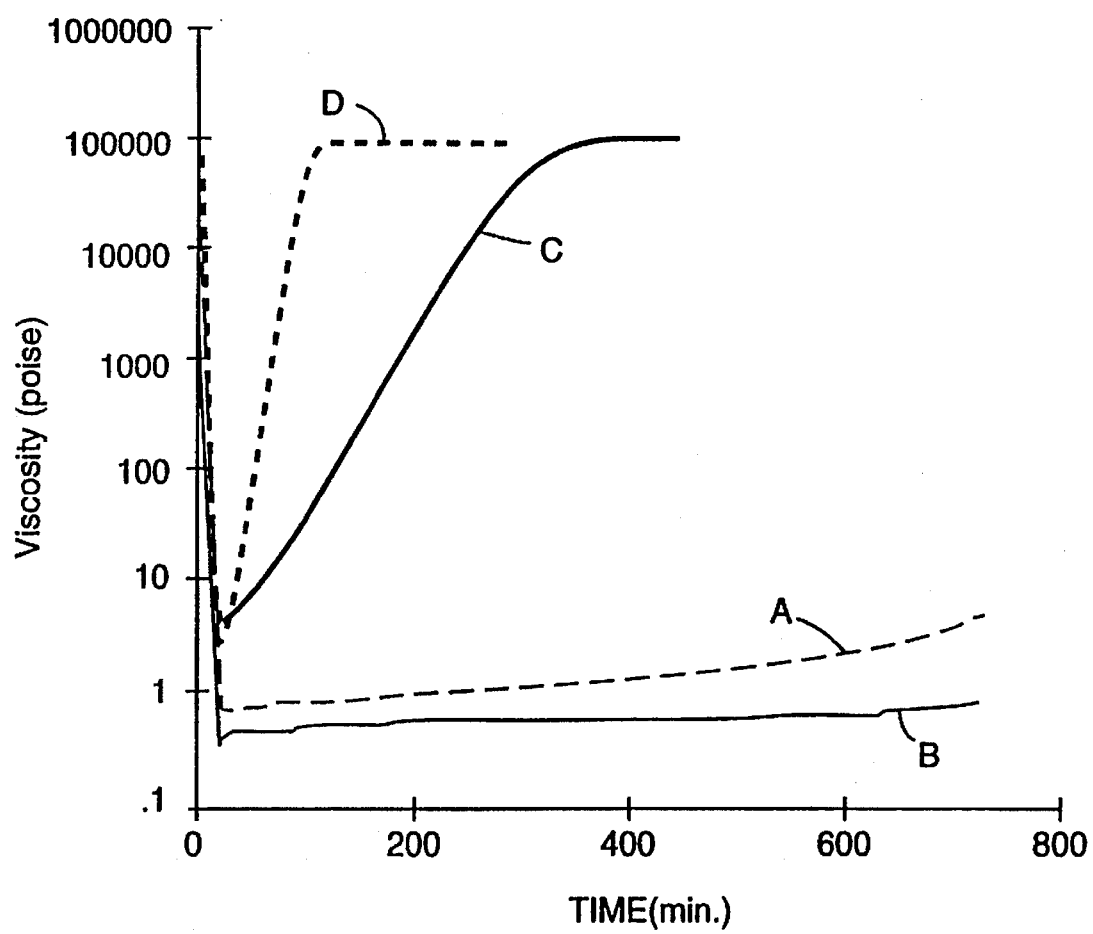
FIG. 1 shows a plot of viscosity versus time for resin samples held isothermally at 104° C. Sample A comprised no flame retardant; Sample B comprised a non-functional flame retardant of the invention; and Samples C and D comprised functional flame retardants. The plot shows that the non-functional flame retardant has less of an impact on resin viscosity than the functional flame retardant. This is advantageous for processing techniques such as resin transfer molding where the viscosity of the resin must be essentially unaffected by the incorporation of the flame retardant. For further discussion of this FIGURE, see Example 14.

Thermosettable resins that can be used as component (a) in the composition of the invention are epoxy, N,N'-bismaleimide, cyanate ester monomers and prepolymers and mixtures thereof that can preferably be cured by conventional methods such as thermally or via radiation such as UV or electron beam, with or without the use of a catalyst, at room temperatures or above.

1. Epoxy

Epoxy monomers and prepolymers that can be used in the composition of the invention include those that are well known in the art. They are compounds in which there is present at least one linear or branched aliphatic, cycloaliphatic or aromatic structure and one or more epoxy groups, e.g.,

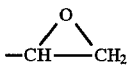

The most preferred epoxy compounds are the aromatic polyepoxides, including the polyglycidyl ethers of polyhydric phenols, glycidyl esters of aromatic carboxylic acids, N-glycidylaminobenzenes, and glycidylamino-glycidyloxybenzenes.

Examples of epoxies useful in the thermosettable resin composition of the invention are described in *Chemistry and Technology*, "Epoxy Resins", Marcel Dekker Inc., 2nd edition, New York (May, 1988) and in U.S. Pat. No. 4,882,370. Examples of curatives, hardeners and catalysts for epoxy resins may also be found in these same references.

2. N,N'-bismaleimide

N,N'-bismaleimide monomers and prepolymers that can be used in the composition of the invention are also well known, many of which can be purchased commercially. They are compounds which comprise more than one maleimido group. Preferably, the compound has two maleimido groups. The compound has the following general formula:

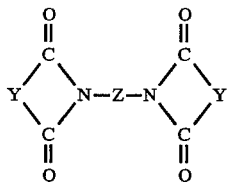

wherein:

Y represents a divalent group containing at least 2 carbon atoms, preferably 2 to 6 carbon atoms, and a carbon-carbon double bond; and Z is a divalent aliphatic, cycloaliphatic, aromatic or heterocyclic group containing at least 2 carbon atoms and generally no more than 20 carbon atoms. Examples of N,N'-bismaleimides useful in the present invention and processes for their preparation can be found in U.S. Pat. Nos. 3,562,223; 3,627,780; 4,468,497; 4,946,908; 4,100,140 and 3,839,358. Examples of curatives, hardeners and catalysts for N,N'-bismaleimides can also be found in these same references.

3. Cyanate Ester

Cyanate ester monomers and prepolymers that can be used in the composition of the invention include those that are well known. Dicyanate esters are compounds having the general formula:

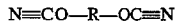

$$N\equiv CO-R-OC\equiv N$$

wherein R is a divalent aromatic hydrocarbon residue that comprises at least one aromatic moiety such as benzene, naphthalene, anthracene, phenanthrene and the like, and contains a total of up to 40 carbon atoms, including the aromatic moiety. For example, the dicyanate ester of bisphenol A, wherein the cyanate ester groups are attached in the para positions of the benzene rings, is one useful compound for the present invention.

Useful cyanate ester materials, and examples of curatives, hardeners and catalysts for these materials may be found in U.S. Pat. No. 4,608,434. Useful bismaleimide/cyanate ester combinations are described in U.S. Pat. No. 4,769,440 and U.S. Pat. No. 4,820,797.

Commercially available cyanate esters that are useful in the present invention include: AroCy™ B10, AroCy™ L10 and RTX™-366 cyanate esters available from Ciba-Geigy; XU71787, a polycyanate ester of a polyphenol adduct of dicyclopentadiene, available from Dow Chemical Company; and BT 2160 resin, a prepolymer of bisphenol A dicyanate ester containing 10% by weight of 4,4'-methylenedianiline bismaleimide, available from Mitsubishi Gas Chemical Company.

Other combinations of resins, such as bismaleimide/epoxy, cyanate ester/epoxy, and bismaleimide/epoxy/cyanate esters are also of utility in the present invention.

Non-Functional Cyclophosphazene

The cyclophosphazene of the composition of the present invention does not covalently bond with the resin network. In addition, it is substituted with aryloxy groups such as phenoxy or substituted aryloxy groups. The cyclophosphazene is believed to provide an effective amount of phosphorous and nitrogen to render the thermosettable resin composition flame retardant. The quantity of cyclophosphazene employed in the resin may be varied, depending on the flame retardant and the resin system employed. In general, it is desirable that the amount of cyclophosphazene present in the resin be at least 3 parts by weight of cyclophosphazene per 100 parts by weight of resin. The amount of cyclophosphazene may be less than 3 parts by weight when additional flame retardant is employed. An upper limit for the amount of cyclophosphazene present in the resin is not critical to the invention; however, at high cyclophosphazene loadings in some resin networks, other parameters (such as glass transition temperature, $T_g$) may be negatively impacted. A preferred upper limit for the amount of cyclophosphazene is about 50 parts by weight per 100 parts resin, more preferably 40 parts by weight.

The amount of aryloxy substitution present in the cyclophosphazene of the present invention will impact the thermal stability and moisture uptake of the resin. It is preferred that the amount of aryloxy substitution be greater than 50%, more preferably 100%, for performance applications such as resins used or processed at high temperatures or in aggressive environments. For some applications, however, acceptable performance may be achieved at aryloxy substitution levels below 50%, particularly if the remaining substituents are fluorinated alkoxy of the type $OCH_2R_f$.

The cyclophosphazene may be a trimer, tetramer or higher cyclic. Preferably, the cyclophosphazene is a trimer or tetramer having the general formulae, respectively:

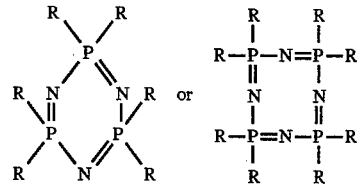

wherein R is selected from the group consisting of $R^1$, $XR^1$, and $OCH_2R_f$. $R^1$ is selected from the group consisting of linear or branched alkyl having one to twelve carbon atoms; cycloalkyl having five to six carbon atoms; and substituted and unsubstituted aryl. X is selected from the group consisting of oxygen, sulfur, and $NR^2$, wherein N is nitrogen and $R^2$ is an alkyl having one to four carbon atoms. When X is oxygen, two $R^1$ groups may be covalently bonded to form a divalent group that is selected from the group consisting of 1,8-naphthalenediyl, 4,5-naphthalenediyl and 2,2'-biphenylene. $R_f$ is a polyfluoroaliphatic group having 2 to 20 carbon atoms and up to 5 ether oxygen atoms. Preferably $R_f$ is a polyfluoroalkoxide having the structure $OCH_2CF_3$ or $OCH_2CF_2OC_4F_9$. It is also required that no more than three R groups comprise $R^1$ as defined above or $XR^1$ where X is oxygen and $R^1$ is linear or branched alkyl.

The cyclophosphazenes are prepared as taught in the example section and references indicated therein. The physical characteristics of the aryloxy cyclophosphazenes may be easily controlled. In general, single substituent aryloxy cyclophosphazenes with ortho or para substitution can typically be isolated as solids with melting points that vary with the nature of the aryloxy side group. For instance, hexaphenoxycyclotriphosphazene has a melting point of 105° C., whereas hexakis(4-phenylphenoxy)cyclotriphosphazene has a melting point of 201° C. When aryloxy groups are substituted in the meta position, the melting point is significantly lower and often times the meta-substituted phenoxy cyclotriphosphazene may be a liquid at room temperature. Alternatively, the cyclophosphazenes can be synthesized to incorporate a combination of aryloxy side groups, such as tris(phenoxy)-tris(m-trifluoromethylphenoxy) cyclotriphosphazene. This is generally referred to as a co-substituent or mixed substituent aryloxy group substitution. When the synthesis of such compounds involves the sequential addition of the nucleophiles, the final structure is actually a distribution of different substituted products, represented, for example, by $N_3P_3(OC_6H_5)_{6-x}(OC_6H_4-CF_3-m)_x$ wherein m represents the meta isomer position and x is an integer from 0 to 6. The result is a product that tends to resist solidification and has compatibility characteristics that are effectively the average of the two different single substituent flame retardants. Thus, the processing properties and compatibility or solubility characteristics of the flame retardant may be tailored by controlling the substituted nature of the cyclophosphazene. For example, the cyclophosphazene may be designed to be melt compatible with the resin, yet phase separate upon curing. This could facilitate preservation of the glass transition temperature of the cured resin. Moreover, the nature of the non-functional side group does not seem to significantly influence the efficacy of the flame retardant. It is also possible to physically blend two or more cyclophosphazenes to tailor the process properties and compatibility of the resulting flame retardant. The blend may comprise, for example, mixtures of same or different trimer, tetramer and/or higher cyclic cyclophosphazenes.

Statement of Use

The thermosettable compositions of the invention are suitable for use as impregnating, laminating or molding resins. They can be used as sealants, insulating materials and adhesives especially as a sealant for semiconductors and other electronic circuit parts. The compositions may be used in the electronics industry to bond electronic components to circuit boards. The compositions may also be used to make the circuit boards themselves. They are particularly suitable for use in prepregs for the production of space age reinforced composite structures.

The thermosettable resin composition of the invention can be used to impregnate woven or non-woven webs, filaments, rovings or the like in the preparation of prepregs. Fibers that can be used in such prepregs include organic and inorganic fibers such as glass fibers, carbon or graphite fibers, ceramic fibers, boron fibers, silicon carbide fibers, polyimide fibers and the like, and mixtures thereof. The thermosettable composition of the invention can also be used to coat various substrate including woven and non-woven webs, films and foils of organic and inorganic materials including, for example, such organic materials as polyolefins, polyesters, polyimides, and the like and inorganic materials such as ceramics, copper, nickel, and gold.

The composition of the invention can also contain additives to modify characteristics of the cured composition. Additives that can be used include: inert fillers, pigments, and dyes. Specific examples of additives include: chopped fibers comprising ceramic, glass, boron or carbon; inorganic powders comprising kaolin, chalk, silica, antimony oxides, titanium oxide, or carbon; and solid microspheres or hollow microballoons comprising glass, ceramic, or metal. The composition of the invention may also be modified with toughening agents and other additives to render the composition suitable for use as a structural adhesive.

The thermosettable compositions of the invention are prepared by mixing the curatives, hardeners, and optionally catalysts, and modifying additives into the thermosettable resin at a temperature at which the thermosettable resin is fluid, generally from about 30° C. to 150° C. The mixing is generally accomplished by conventional high shear mixing devices, for example, a planetary mixer, a kneader, a vacuum mixer, a ball mill, paint mill or high speed stirrer. The resin is then typically poured into a mold and allowed to cure.

The present invention also includes the incorporation of other additional flame retardants to the thermosettable resin comprising non-functional cyclophosphazene. The additional flame retardant may work in combination with the non-functional cyclophosphazene to improve the flame retardancy of the resin in an additive or synergistic fashion. One benefit of employing additional flame retardant may be to reduce quantity requirements of the flame retardant material. This may result in improved physical resin properties at a reduced cost. For example, when the thermosettable resin is based on an epoxy material, it is possible to include nitrogen-containing heterocyclic materials, which by themselves, may have flame retardant properties. Heterocyclic materials include nitrogen-containing epoxies such as Araldite™ PT 810 and Aralcast™ XU AY 238 epoxies, both available from Ciba-Geigy. Other heterocyclic materials include triazine-containing materials such as trichlorotriazine, tri-isocyanurate materials such as melamine isocyanurate and materials derived from cyanate esters.

Objects and advantages of this invention are further illustrated by the following examples, but the particular materials and amounts thereof recited in these examples, as well as other conditions and details, should not be construed to unduly limit this invention. In the examples all parts and percentages are by weight and temperatures are in degrees centigrade unless otherwise noted.

EXPERIMENTAL METHODS

Cyclophosphazene Synthesis:

The cyclophosphazenes described in these examples were prepared by conventional methods familiar to one skilled in the art of chemical synthesis. In general, the non-functional, aryloxy cyclophosphazenes were prepared by the reaction of unsubstituted or substituted phenol with hexachlorocyclotriphosphazene and potassium hydroxide in toluene. At temperatures between 80° and 110° C., water was removed from the reaction mixture by azeotropic distillation. The progress of the reaction was easily monitored by various analytical methods including HPLC, GC and $^{31}$P NMR spectroscopy.

Mixed substituent aryloxy cyclophosphazenes were prepared in a similar manner; however, sequential addition of the desired number of equivalents of the phenols was made to produce a partially substituted cyclophosphazene which was then reacted with additional unsubstituted or substituted phenol until all remaining P-Cl bonds were replaced. The progress of the reaction was easily monitored by $^{31}$P NMR spectroscopy. The reaction was considered complete when no further changes were detected in the $^{31}$P NMR spectrum of the reaction mixture. Typical chemical shifts of the aryloxy phosphazene trimers were approximately δ+6.5 ppm relative to phosphoric acid. The reaction mixture was filtered to remove, potassium chloride (KCl) followed by water washing and base extraction to remove residual phenols and KCl. The solvent was then removed under vacuum. Upon solvent removal, the single substituent phosphazenes typically crystallized from the oily product mixture, whereas mixed substituent cyclophosphazenes remained as viscous oils or crystallized only very slowly. Additional experimental details are provided in Example 1. Specific structures of the phosphazenes are listed in FIGS. 1–6.

Formula 1: Structures of Non-functional Aryloxy Cyclophosphazenes

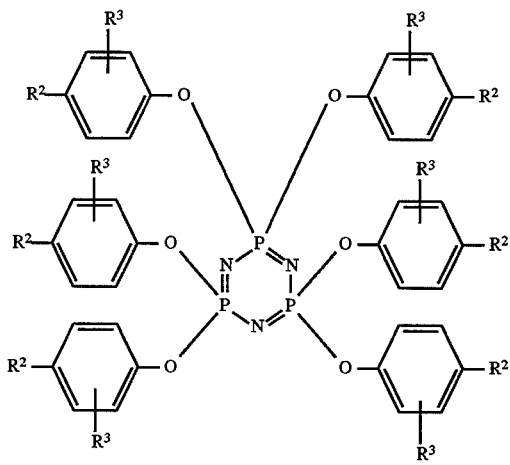

| Structure # | R² | R³ | R³ Position Relative to Oxygen |
|---|---|---|---|
| 1a | H | H | * |
| 1b | F | F | meta |
| 1c | H | Cl | ortho |
| 1d | C₆H₅ | H | * |
| 1e | H | CF₃ | meta |
| 1f | OCH₃ | H | * |

*Position not relevant

Formula 2: Structures of Non-functional Alkoxy-Containing Cyclophosphazenes

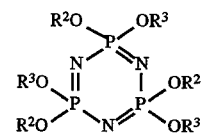

| Structure # | R² | R³ |
|---|---|---|
| 2a | C₂H₅ | C₂H₅ |
| 2b | C₃H₇ | C₃H₇ |
| 2c | iso-C₃H₇ | iso-C₃H₇ |
| 2d | iso-C₃H₇ | C₆H₅ |
| 2e* | CH₂CF₃ | C₆H₅ |

*The structure of 2e is N₃P₃(OC₆H₅)₂(OCH₂CF₃)₄

Formula 3: Ring Functional Cyclophosphazenes

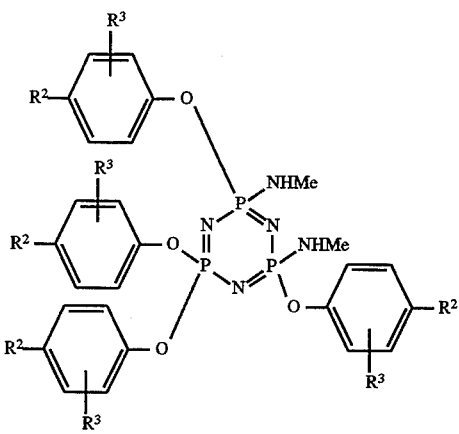

| Structure # | R² | R³ | R³ Position Relative to Oxygen |
|---|---|---|---|
| 3a | H | H | * |
| 3b | H | Cl | ortho |

*Position not relevant

Formula 4: Ring Functional Cyclophosphazenes

| Structure # | R² |
|---|---|
| 4a | H |
| 4b | C₆H₅ |

Formula 5: Side Group Functional Cyclophosphazenes

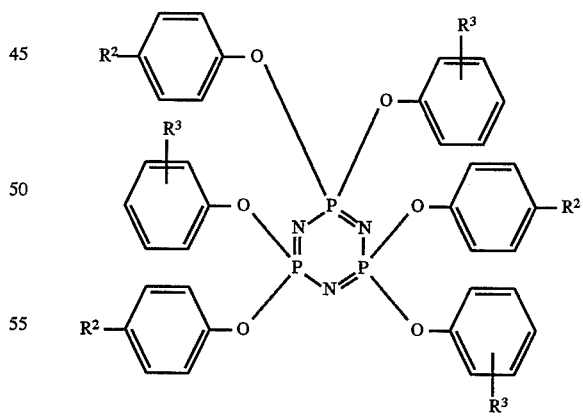

| Structure # | R² | R³ | R³ Position Relative to Oxygen |
|---|---|---|---|
| 5a | NH₂ | H | * |
| 5b | NH₂ | Cl | ortho |
| 5c | OH | Cl | ortho |

*Position not relevant

-continued

Formula 6: Non-functional Bicyclophosphazenes

[Chemical structure diagram]

| Structure # | R² | R² Position |
|---|---|---|
| 6a | OCH₃ | para |
| 6b | OCH₃ | meta |

Other alternative methods of preparation of these and related compounds are described by Allcock, H. R. et al in the Journal of Chemical Society, Chem Comm., Volume C4, page 149 (1970); Allcock, H. R., et al, in *Inorganic Chemistry*, Volume 14, page 2433 (1975); and Jeneau, et al in U.S. Pat. No. 4,576,806. Tris(2,2'-oxybiphenyl) and 1,1-dichloro3,5-bis(2,2'-oxybiphenyl) cyclotriphosphazene were prepared according to the method of Allcock, H. R., et. al. as described in *Inorganic Chemistry*, Volume 5, page 1016 (1966). Amine functional cyclophosphazenes, 1,1-$N_3P_3(NH_2)_2(OR)_4$ were prepared by the methods of Takahashi and Ishikawa described in *Kobunshi Ronbunshu*, Volume 47, page 727 (1990); Feister and Moellar, *Journal of Inorganic Nuclear Chemistry*, Volume 29, page 2731 (1967) or Allcock, H. R. et al, *Organometallics*, Volume 21, page 323 (1988). Anilino and phenol functional aryloxy cyclophosphazenes, $N_3P_3(OC_6H_5)_x (OC_6H_4—Y)_{6-x}$ where Y=$NH_2$ or OH and x can be 0 to 6; were prepared according to the method of Allcock and Chang described in *Macromolecules*, Volume 24, page 993 (1991), and Gleria et al, *Macromolecules*, Volume 25 page 2569 (1992), respectively. Alkoxy cyclophosphazenes $[NP(OC_2H_5)_2]_3$; $[NP(OC_3H_7)_2]_3$ or $[NP(iso-OC_3H_7)_2]_3$ were prepared according to the method of Fitzsimmons and Shaw described in the *Journal of Chemical Society*, Volume 41, page 1735 (1964).

EXAMPLE #1

Preparation of hexaphenoxycyclotriphosphazene
(Structure 1a from Formula 1)

A mixture of 700 ml of toluene, 429 g of phenol (4.56 moles), 270 g potassium hydroxide (4.82 moles), and 73.5 g of tetrabutyl ammonium bromide (as a phase transfer catalyst) were placed into a flask equipped with an addition funnel and Dean Stark trap. The mixture was heated to reflux and a toluene solution of 203 g of hexachlorocyclotriphosphazene (0.58 moles, available from Nippon Soda Co., Ltd. Japan) in 300 ml of toluene was added over a period of about 15 minutes. The mixture was heated at reflux (about 110° C.) for about 12 hours with water being removed by azeotropic distillation.

The reaction mixture was analyzed using $^{31}P$ NMR spectroscopy. When the $^{31}P$ NMR spectrum showed a singlet at δ+6.5 ppm, complete Cl atom substitution had been achieved. The reaction mixture was filtered to removed potassium chloride, followed by water washing and base extraction to remove residual potassium chloride and phenol. The toluene solvent was removed by roto-evaporation to produce a light brown, viscous oil. Upon further drying, the oil solidified to produce 355 g (85% yield) of hexaphenoxy cyclotriphosphazene as a brown solid having a melting point of 98°–103° C. If desired, it is possible to purify the crude product further by recrystallization from a hot solution of methanol and tetrahydrofuran (9 to 1 by volume) followed by cooling the solution to 4° C. for 16 hours. The purified solid is a free flowing powder with a light tan color having a melting point of 104°–106° C.

Examples 2–9 which follow describe the methods used to prepare epoxy, cyanate ester and bismaleimide resin systems with and without flame retardant materials. The glass transition temperature for each resin system is also provided in these examples. The sample numbers used in Examples 2–9 are referenced throughout the rest of the example section where various properties of the resin systems are evaluated.

EXAMPLE #2

Preparation of Epoxy Resin Systems and
Determination of Glass Transition Temperature $T_g$
for Cured Resins Glass transition temperatures ($T_g$) for cured resins were determined by thermomechanical analysis (TMA) using a TA 2940™ Instrument with an expansion probe with an applied force of 0.05 Newtons. Data were collected on a second heat using a temperature ramp of 5° C./min from 50° to 250° C. The samples were protected from thermal oxidation by maintaining a positive flow of nitrogen gas through the furnace cell for the duration of the experiment. The glass transition temperatures were calculated from the inflection point of the graph of thermal expansion (ppm) vs temperature (° C.).

Epoxy resin samples 1–15 were prepared by melting the desired amount of PR 500 molding resin (available from 3M Company) as listed in Table 1 with the desired flame retardant at a temperature between 75° C. and 125° C. After stirring and degassing, a homogeneous, viscous syrup was obtained (unless otherwise noted). The resin/flame retardant mixture was transferred to a mold and cured at 177° C. for 4 hours. The mold was selected from the following list: (1) a 57 mm diameter aluminum pan; (2) a 4"×4"×0.125" (102 mm×102 mm×3 mm) premade glass mold or (3) a 8"×4"× 0.125" (204 mm×102 mm×3 mm) premade glass mold. The glass molds were lightly coated with a mold release agent such as RAM™ 225 Mold Release available from Ram Chemical Company. The cured resin was allowed to cool to room temperature before removal from the mold.

The flame retardants employed in the resin samples are defined by reference to the structures given in FIGS. 1–6, except that Samples 14–16 comprised commercially available flame retardants as indicated in Table 1. Sample 14 comprised Hostaflam™ TPAP-750 flame retardant, a particulate poly(ammonium phosphate) flame retardant available from Hoechst-Celanese Corporation. Sample 15 comprised Kronitex™-3600 an alkyl, aryl phosphate ester available from FMC Corporation.

Sample 16 comprised a bromine-containing epoxy that is often used in conventional epoxy systems to impart flame retardant properties. Sample 16 was prepared by mixing 35.0 g Quatrex™ 6410 (a brominated bisphenol A epoxy available from Dow Chemical, 49% w/w bromine) with 65.0 g EPON HPT™ 1079 (fluorene based epoxy available from Shell Chemical, hereinafter referred to as "FEP" or HPT™

1079) at approximately 175° C. to produce a clear viscous syrup. The epoxy mixture was allowed to cool to about 150° C. and was mixed with 48.8 g of CAF curative, 9,9-bis(3-chloro-4-aminophenyl)fluorene, prepared according to the method of Schultz et al, U.S. Pat. No. 4,684,678. The mixture was stirred and degassed at approximately 150° C. until a clear, viscous syrup was obtained. The warm, viscous syrup was poured into a mold and cured for 4 hours at 177° C. followed by a one hour post cure at 200° C. The cured sample was allowed to cool to room temperature before removal from the mold.

The specific formulations for Samples 1–16 are summarized in Table 1 below, along with the corresponding $T_g$ for each sample.

TABLE 1

Preparation of PR 500 Epoxy Resin Systems

| Sample # | Wt Epoxy (g) | Flame Retardant | Wt Flame Retardant (g) | % Flame Retardant | $T_g$ (°C.) TMA | Notes |
|---|---|---|---|---|---|---|
| 1 | 35.0 | none-control | 0 | 0 | 196 | |
| 2* | 20.0 | 1a | 3.5 | 15 | 153 | |
| 3* | 3.5 | 1b | 0.62 | 15 | 182 | a |
| 4* | 4.3 | 1c | 0.75 | 15 | 167 | |
| 5* | 20.0 | 1d | 3.5 | 15 | 171 | |
| 6 | 41.5 | 2a | 7.4 | 15 | 200 | b |
| 7 | 2.9 | 2b | 0.51 | 15 | 175 | |
| 8 | 3 | 2c | 0.53 | 15 | 175 | b |
| 9* | 36.3 | 2e | 6.4 | 15 | 191 | a |
| 10 | 5.0 | 5a | 0.55 | 10 | 178 | |
| 11 | 5.0 | 5c | 0.88 | 20 | 163 | |
| 12* | 3.0 | 6a | 0.72 | 15 | 174 | |
| 13* | 2.9 | 6b | 0.71 | 15 | 173 | |
| 14 | 36.4 | Hostaflam™ TPAP-750 | 6.4 | 15 | 204 | c |
| 15 | 36.4 | Kronitex™-3600 | 6.5 | 15 | 124 | |
| 16 | e | e | | 11.5 | 207 | d |

*SAMPLES OF THE PRESENT INVENTION
a) Flame retardant was compatible with the resin in the melt but phase separated after cure.
b) Cured resin had significant void formation due to flame retardant volatility and/or decomposition during cure.
c) Particulate flame retardant was incompatible both during processing and after cure.
d) Weight percent flame retardant represents the amount of bromine present in the formulation described for sample 16.
e) See description in text for quantities and materials used.

EXAMPLE 3

Preparations of FEP/CAF Epoxy Resins Systems

FEP/CAF epoxy resin systems (samples 17–19) were prepared by allowing the desired flame retardant (see Formulae 1–6) to melt into FEP at approximately 150° C. with mechanical stirring. After complete mixing, the mixture was allowed to cool to about 130° C. The FEP/flame retardant mixture was then mixed and degassed at this temperature with CAF to produce a homogeneous viscous syrup. While still warm and pourable, the mixture was then transferred to a mold and cured for 4 hours at 177° C. followed by a 1 hour post cure at 225° C. The cured specimens were then allowed to cool to room temperature before removal from the mold. Specific formulations are given in Table 2 below, along with the $T_g$ of each specimen, determined as in Example 2.

TABLE 2

Preparation of FEP/CAF Epoxy Resin Systems

| Sample # | Wt FEP (g) | Wt CAF (g) | Flame Retardant | Wt. Flame Retardant (g) | % Flame Retardant | $T_g$ (°C.) TMA |
|---|---|---|---|---|---|---|
| 17 | 10.0 | 5.75 | non-control | 0 | 0 | 234 |
| 18* | 10.0 | 5.75 | 1a | 2.78 | 15 | 176 |
| 19 | 20.0 | 7.7 | 4a | 4.88 | 15 | 237 |

*SAMPLE OF THE PRESENT INVENTION

EXAMPLE 4

Preparations of FEP/DGEBA/CAF Epoxy Resins Systems

For samples 20–25, a master batch of FEP/DGEBA was prepared by mixing equal parts by weight FEP with DGEBA (diglycidylether bisphenol-A epoxy, available from Shell Chemical as EPON™ 828, hereinafter referred to as either DGEBA or EPON™ 828). The epoxy mixture was stirred at about 100° C. until a clear viscous syrup was obtained. The desired amount of this epoxy mixture was mixed at about 100° C. with the desired flame retardant (see Formulae 1–6) until a homogeneous viscous mixture was obtained. See Table 3 for quantities used. After the epoxy and flame retardant were mixed fully, CAF was added, and the resin was stirred and degassed at 100° C. for about 5 minutes. While still warm and pourable, the mixture was then transferred to a mold and cured for 4 hours at 177° C. followed by a 1 hour post cure at 225° C. The cured specimens were then allowed to cool to room temperature before removal from the mold. The specific formulations are given in Table 3, along with the $T_g$ values determined as in Example 2.

TABLE 3

Preparation of FEP/DGEBA/CAF Resin Systems

| Sample # | Wt FEP (g) | Wt DGEBA (g) | Wt CAF (g) | Flame Retardant | Wt. Flame Retardant (g) | % Flame Retardant | $T_g$ (°C.) TMA |
|---|---|---|---|---|---|---|---|
| 20 | 10.0 | 10.0 | 14.3 | none-control | 0 | 0 | 206 |
| 21* | 10.0 | 10.0 | 14.3 | 1a | 6 | 15 | 164 |
| 22 | 10.0 | 10.0 | 10.3 | 5a | 5.35 | 15 | 195 |
| 23 | 10.0 | 10.0 | 6.3 | 5c | 2.9 | 15 | 181 |
| 24 | 10.0 | 10.0 | 11.7 | 4b | 5.6 | 15 | 207 |
| 25 | 10.0 | 10.0 | 12.9 | 3b | 5.8 | 15 | 180 |

*SAMPLE OF THE PRESENT INVENTION

EXAMPLE 5

Preparations of MY-720™/DDS Epoxy Resins Systems

The epoxy resin systems (samples 26–27) were prepared by allowing the desired flame retardant (see Formulae 1–6) to dissolve into Araldite™ MY-720 (N,N,N',N'-tetraglycidyl-4,4'-diaminodiphenylmethane, available from Ciba-Geigy, at 110° C. to 120° C. while being stirred. After complete mixing of these components, the curative DDS (4,4'-diaminodiphenylsulfone, available from Ciba-Geigy as Hardener HT-976) was added and the mixture was stirred further while being degassed. After about five minutes, the warm viscous syrup was poured into a mold and cured at 177° C. for 4 hours followed by a 1 hour post cure at 225°

C. The specific formulations are listed in the Table 4, along with the $T_g$ values determined as in Example 2.

TABLE 4

Preparation of MY720/DDS Resin Systems

| Sample # | Wt MY-720 (g) | Wt DDS (g) | Flame Retardant | Wt Flame Retardant (g) | % Flame Retardant | $T_g$ (°C.) TMA |
|---|---|---|---|---|---|---|
| 26 | 10.0 | 3.1 | none-control | 0 | 0 | 253 |
| 27* | 10.0 | 3.1 | 1a | 2.3 | 15 | 245 |

*SAMPLE OF THE PRESENT INVENTION

EXAMPLE 6

Preparation of PR 500 Composites by Resin Transfer Molding

Fiber composites were prepared by dissolving the desired flame retardant into PR 500 resin with mechanical stirring and degassing as described for Example 2. After thorough mixing, the warm resin was transferred to a one gallon pail equipped with a resin transfer molding (RTM) pump attachment. A mold was prepared with either AS4-PW carbon fabric or 7781 glass fabric; both fabrics are available from Hercules Company. The carbon fiber composites had 14 ply and $[0/90]_{7s}$ orientation to provide a thickness of 10.2 mm (0.4"). The glass fiber composites had 6 ply and a $[0/90]_{3s}$ orientation to provide a thickness of 10.2 mm (0.4"). The mold was closed and evacuated. The modified PR 500 resin was warmed to 70° C. and injected into the mold and cured at 177° C. (350° F.) for 2.2 hours.

Unless otherwise noted, the cyclophosphazene flame retardants were easily processed into the resins and were fully compatible after curing to yield clear, homogeneous thermosets. The specific composite formulations are given in Table 5, along with the $T_g$ values, determined as in Example 2.

TABLE 5

Preparation of Composites Using Resin Transfer Molding (RTM)

| Sample # | Wt (g) PR 500 | Fiber type | Flame Retardant | Wt Flame Retardant (g) | % Flame Retardant | $T_g$ (°C.) TMA |
|---|---|---|---|---|---|---|
| 28 | 800.0 | carbon fiber AS4-PW | none-control | 0.0 | 0 | 201 |
| 29* | 800.0 | carbon fiber AS4-PW | 1a | 141.0 | 15 | 160 |
| 30* | 800.0 | 7781 glass fiber | 1a | 141.0 | 15 | 150 |
| 31*[1] | 670.0 | carbon fiber AS4-PW | 1b | 118.0 | 15 | 177 |

*SAMPLES OF THE PRESENT INVENTION
[1]Note that for sample #31, the flame retardant 1b was compatible with the resin in the melt phase, but phase separated during the cure.

EXAMPLE 7

Preparation of DEN™438-DEN™-332 Epoxy Resin Systems

Samples 32-35 comprised epoxy resins DEN™438, an epoxy novolac resin, and DER™332, a DGEBA material, (both from Dow Chemical Co.) blended at a 1:1 weight ratio. Samples 34 and 35 further comprised nitrogen-containing epoxies, Araldite™ PT810 and Aralcast™ XU AY 238 hydantoin epoxy, respectively, both epoxies available from Ciba-Geigy. PT 810 comprises 1,3,5-tris(oxiranylmethyl)-1, 3,5-triazine-2,4,6 (1H,3H,5H)trione. XU AY 238 comprises 5-ethyl-5-methyl-1,3-bis(oxiranylmethyl)-2,4-imidazolidinedione. The epoxy materials were first blended together, and then the epoxy blend was mixed with CAF curative and flame retardant (if any). The specific formulations of each sample are given in Table 6. The resulting mixture was heated to about 90° C. and thoroughly mixed using a mechanical stirrer for about 15 minutes. The pasty mixture was then de-gassed in a heated vacuum oven at 100° C. for about 5 minutes. It was then poured into a pre-heated glass mold and cured at 177° C. for 4 hours.

Samples 36-37 comprised DEN™438 (49.1% wt), DER™332 (43.0% wt.), EPON™ 828 (5.9% wt.), polysulfone (2.0% wt., available as Udel™ P3500 from Amoco Corp.) and dicyandiamide catalyst ("DICY", available as Amicure™ CG-1400 from Air Products and Chemicals, Inc., 0.5% wt). OTBAF [bis 9,9-(3-methyl-4-aminophenyl) fluorene, prepared according to the method of Schultz et al, described in U.S. Pat. No. 4,684,678] was used as the curative. Sample 37 further comprised a flame retardant given in Formulae 1, Structure 1a and Aralcast™ XU AY 238, a nitrogen-containing hydantoin epoxy described above. The DEN™438, DER™332, EPON™828, polysulfone, hydantoin epoxy (if any) and flame retardant (if any) were first blended together. This blend was then mixed with OTBAF and DICY in a Brabender plasti-corder at 57° C. for 15 minutes to give a pasty mixture. The specific formulations are given in Table 6. Typically, a small amount of a given formulation was placed in an aluminum pan and cured in a 177° C. oven for 4 hours. Alternatively, the various components were mixed by means of a mechanical stirrer at about 70° C. The mixture was then de-gassed in a vacuum oven at 100° C. for about 5 minutes. It was then poured into a pre-heated glass mold and cured at 177° C. for 4 hours. Table 6 shows the amount of the various components used in the preparation of samples 32-37, along with the $T_g$ for each sample determined using differential scanning calorimetry (DSC) using a TA 912™ Instrument at a heating rate of 15° C./min from 50° C. to 250° C.

TABLE 6

Preparation of DEN™438-DER™332 Epoxy Resin Systems

| Sample # | Resin | Resin (g) | CAF (g) | OTBAF (g) | Flame Retardant | Flame Retardant (g (%)) | PT810 (g (%)) | Hydantoin (g (%)) | Total Wt % Flame Retardant | DICY (g) | $T_g$ (C.) DSC |
|---|---|---|---|---|---|---|---|---|---|---|---|
| 32 | 1:1 DEN438/DER332 | 30 | 27.1 | 0 | Control | 0 | 0 | 0 | 0 | 0 | 204 |
| 33* | 1:1 DEN438/DER332 | 30 | 27.1 | 0 | PN-TO[1] | 8.6(15) | 0 | 0 | 15 | 0 | 135 |
| 34* | 1:1 DEN438/DER332 PT-810 | 30 | 27.1 | 0 | PN-TO[1] | 5.1(9) | 3.4(6) | 0 | 15 | 0 | 168 |
| 35* | 1:1 DEN438/DER332 XU AY 238 | 10 | 9.0 | 0 | PN-TO[1] | 1.8(9) | 0 | 1.8(6) | 15 | 0 | 187 |
| 36 | 1:1 DEN438/DER332 2% Polysulfone 1% DICY | 35 | 0 | 28.2 | Control | 0 | 0 | 0 | 0 | 0.35 | 199 |
| 37* | 1:1 DEN438/DER332 2% Polysulfone 1% DICY | 35 | 0 | 28.2 | 1a | 3.15(4.6) | 0 | 2.1(3) | 7.7 | 0.35 | 190 |

*SAMPLES OF THE PRESENT INVENTION
[1]PN-TO is a non-functional mixed substituent aryloxy phosphazene trimer available as Ethyl ™ Trimer Oil from Ethyl Corp., Baton Rouge, LA. Ethyl ™ Trimer Oil is a plasticizer for Eypel-A phosphazene polymer.

EXAMPLE 8

Preparation of Cyanate Ester Resin Systems

A measured amount of the neat cyanate ester resin (AroCy™ B30, AroCy™ L10 or RTX™-366 available from Ceiba-Geigy) was melted and blended with the desired flame retardant. The resulting mixture was heated in a vacuum oven at 100° C. for about 5 minutes. It was then poured into a pre-heated glass mold and cured at about 180° C. for 15 hours, followed by a post-cure at 250° C. for 1 hour. The specific formulations and the $T_g$ values (determined using either TMA as described in Example 2 or DSC as described in Example 7) are given in Table 7.

TABLE 7

Preparation of Cyanate Ester Formulations

| Sample | Resin | Flame Retardant | Wt % FR | Wt Resin (g) | Wt FR (g) | $T_g$ (°C.) |
|---|---|---|---|---|---|---|
| 38 | AroCy B30 | none-control | 0 | 15.1 | 0 | 270(TMA) |
| 39* | AroCy B30 | 1a | 5 | 15.3 | 0.8 | 273(TMA) |
| 40* | AroCy B30 | 1a | 10 | 15.1 | 1.5 | 260(TMA) |
| 41* | AroCy B30 | 1a | 15 | 14.7 | 2.3 | 245(TMA) |
| 42* | AroCy B30 | 1a | 20 | 12.7 | 2.5 | 242(TMA) |
| 43* | AroCy B30 | 1a | 25 | 13.4 | 3.4 | 226(TMA) |
| 44* | AroCy B30 | 1a | 30 | 13.3 | 4 | 220(TMA) |
| 45 | AroCy L10 | none-control | 0 | 30 | 0 | 277(DSC) |
| 46* | AroCy L10 | 1a | 15 | 30 | 4.5 | 271(DSC) |
| 47 | RTX-366 | none-control | 0 | 12 | 0 | 196(DSC) |
| 48* | RTX-366 | 1a | 15 | 12 | 1.8 | 160(DSC) |

*SAMPLES OF THE PRESENT INVENTION

EXAMPLE 9

Preparation of Bismaleimide Resin Systems

The base bismaleimide resin was prepared by mixing 80 parts of Shell Compimide™ 358 resin and 20 parts of Shell Toughening Modifier TM-121. 30 g of this base resin was mixed with the flame retardant. The resulting mixture was degassed at about 150° C. for about 5 minutes, and then poured into a warm glass mold and cured according to the following schedule: 2 hours at 190.5° C. and 5 hours at 248.8° C. The control specimen was prepared similarly without the flame retardant. The specific formulations and $T_g$ values for each sample are given in Table 8.

TABLE 8

Preparation of Bismaleimide Formulations

| Sample | Resin | Flame Retardant | Wt % FR | Wt Resin (g) | Wt FR (g) | $T_g$ (C.) |
|---|---|---|---|---|---|---|
| 49 | BMI | none-control | 0 | 30 | 0 | *** |
| 50* | BMI | 1a | 25 | 30 | 7.5 | *** |

*SAMPLES OF THE PRESENT INVENTION
***No glass transition temperature was detected by either TMA or DSC

EXAMPLE 10

Determination of Thermal Stability

The thermal stability of eight resins were determined by thermogravimetric analysis (TGA) to demonstrate that the incorporation of non-functional aryloxy cyclophosphazene flame retardants into epoxy resins does not negatively affect the thermal stability of the resins.

A 15 to 30 mg sample of the resin (listed in Table 9 by reference to a sample described in previous examples) was heated in a TA 2950™ TGA. The TGA was programmed so that the specimen were exposed to sequential, 60 minute isotherms of 220° C., 260° C. and 300° C. A positive flow (approximately 60 cc/min) of air was maintained through the furnace cell during the experiment. The weight losses for each sample observed after each of the 60 minute isotherms are given in Table 9.

TABLE 9

Determination of Thermal Stability for Epoxy Resins

| Sample # | Flame retardant | Wt loss @ 220° C. (%) | Wt loss @ 260° C. (%) | Wt loss @ 300° C. (%) |
|---|---|---|---|---|
| 1 | none-control | <0.5 | 1.00 | 2.10 |
| 2* | 1a | <0.5 | 2.10 | 4.20 |
| 4* | 1c | <0.5 | 1.10 | 2.20 |
| 7 | 2b | 0.90 | 1.10 | 7.00 |
| 8 | 2c | 1.30 | 5.30 | 10.10 |
| 10 | 5a | 0.60 | 1.10 | 2.40 |
| 11 | 5c | 0.60 | 1.80 | 5.10 |
| 13* | 6a | 0.50 | 1.10 | 3.00 |
| 16 | Br | 0.70 | 0.90 | 40 |

*SAMPLES OF THE PRESENT INVENTION

From this experiment it can be concluded that the non-functional aryloxy phosphazenes (samples 2, 4 and 13) do not negatively impact the thermal stability of the resin. In contrast, the samples comprising alkoxy phosphazenes (Samples 7 and 8), the functional phosphazenes (Samples 10 and 11) and the brominated epoxy flame retardant (Sample 16) exhibit higher weight loss and hence possess lower thermal stability.

EXAMPLE 11

Vertical Burn Test for Neat Resin Epoxy Thermosets

In this example, neat epoxy resin samples corresponding to samples 1, 2, 4, 6, 12, 17, 18, 19, 20, 21, 23–27 were burned using a vertical burn test to evaluate the ability of the phosphazenes to impart flame retardant properties to the thermoset network. The resin samples were prepared as described previously in the examples and cut into dimensions of 5"×0.5"×0.125" (127 mm×12.7 mm×3.18 mm). A flame source was procured according to the method described in IPC [Institute for Interconnecting and Packaging Electronic Circuits] Test Method 2.3.10. Each sample was exposed to a first flame application (1st FA, in Table 10) for 10 seconds. The flame source was removed, and the time to self-extinguish was reported. If the sample did not burn, a second flame application was applied to the sample (2nd FA, in Table 10) for another 10 seconds. The flame source was removed and the time to self-extinguish was reported. If after these two flame exposures the sample did not support combustion, the flame was applied a third time (3rd FA, Table 10) until sustained ignition occurred and the time to ignition was reported. In all cases, the burn performance was compared to a control sample that contained no flame retardant. Burn time values reported in Table 10 represent the average of at least three samples. The structures of the cyclophosphazene flame retardant additives are shown in Table 10 by reference to Formulae 1–6.

TABLE 10

Vertical Burn Test Data

| Sample # | FR Structure | 1st FA (sec) | 2nd FA (sec) | 3rd FA (sec) | Notes |
|---|---|---|---|---|---|
| 1 | none-control | 28 | n/a | n/a | |
| 2* | 1a | dni | dni | 51 | |
| 4* | 1c | dni | 3 | n/a | |
| 6 | 2a | 11 | n/a | n/a | |
| 9* | 2e | dni | dni | 104 | |
| 12* | 6a | dni | dni | >180 | |
| 17 | none-control | 29 | n/a | n/a | |
| 18* | 1a | dni | dni | 51 | |
| 19 | 4a | 36 | n/a | n/a | FD/BTC |
| 20 | none-control | 81 | n/a | n/a | |
| 21* | 1a | 2 | <1 | n/a | |
| 23 | 5c | 7 | n/a | n/a | |
| 24 | 4b | 45 | n/a | n/a | FD/BTC |
| 25 | 3b | 20 | n/a | n/a | |
| 26 | none-control | 125 | n/a | n/a | FD/BTC |
| 27* | 1a | 4 | n/a | n/a | |

*SAMPLES OF THE PRESENT INVENTION
FD/BTC = flaming drops and burn to clamp, denotes catastrophic failure
n/a = test was discontinued because of sample combustion in a previous flame application
dni = sample did not ignite during flame application From these data it can be concluded that the resin samples which contained the non-functional phosphazenes (samples 2, 4, 9, 12, 18, 21, 27) were effective in imparting flame retardant properties to the epoxy network. In all cases, the thermoset systems that contained the non-functional cyclophosphazenes were more flame retardant then thermoset systems that did not contain any flame retardant additive or contained a ring functional phosphazene of the type shown in Formulae 3 or 4 (Samples 19 and 25).

EXAMPLE 12

Vertical Burn Test for Epoxy Fiber Composites and Cyanate Ester Thermosets

In this example, a modification of the burn test of Example 11 was utilized. The samples were exposed to a flame(procured as in Example 11) until sustained ignition was achieved. The average time to ignite was recorded as $T_{ign}$. Once the sample started burning, the average time to self extinguish was recorded as $T_{ext}$. Results for various samples previously described are listed in Table 11. The values reported represent the average of at least three samples.

TABLE 11

Burn Test Data for Fiber Composites, Nitrogen-Containing Epoxies and Cyanate Ester Thermosets

| Sample # | FR Structure | $T_{ign}$ (sec) | $T_{ext}$ (sec) |
|---|---|---|---|
| 28 | none-control | 28 | 77 |
| 29* | 1a | 40 | 8 |
| 30* | 1a | 40 | 4 |
| 31* | 1b | 52 | 10 |
| 32 | none-control | 30 | 7 |
| 33* | PN-TO | 46 | 2 |
| 34* | PN-TO | 47 | 3 |
| 35* | PN-TO | 46 | 2 |
| 45 | none-control | 18 | 124 |
| 46* | 1a | 30 | 89 |
| 47 | none-control | 13 | 63 |
| 48* | 1a | 53 | 4 |
| 51[1] | none-control | 2 | 120 |
| 52*[1] | 1a | 11 | 117 |

*SAMPLES OF THE PRESENT INVENTION
[1] Samples 51 and 52 were prepared using the same procedures as for Samples 38 and 41, respectively, except that AroCy ™ B10 cyanate ester from Ciba-Geigy was used in place of AroCy ™ B30.

From these data it can be concluded that the non-functional cyclophosphazenes (Samples 29, 30, 31, 33, 34, 35, 46 and 48) are effective flame retardants in epoxy/fiber composites and in cyanate ester resins. The samples containing the non-functional cyclophosphazenes had longer $T_{ign}$ times and shorter $T_{ext}$ times than the control resins. The data also indicate that the resin transfer molding (RTM) composite systems that contain the non-functional cyclophosphazenes (Samples 29–31) were more flame retardant than composites that did not contain any flame retardant (Sample 28).

EXAMPLE 13

Water Pickup Data for Epoxy and Cyanate Ester Resin Thermosets

Moisture uptake data were obtained by exposing neat resin or fiber composite samples to 100% relative humidity at 82° C. until equilibrium moisture uptake was obtained. At least two replicate samples were measured, and average values are given in Table 12. After equilibrium moisture pickup was obtained, each sample was redried to a constant weight to determine if any of the phosphazene or other components had been extracted during the experiment. Typically, the redried weight was within ±0.05% of the initial weight.

TABLE 12

Water Pickup of Flame Retardant Thermoset Resins

| Sample | FR Structure | Wt % FR | % water pickup |
|---|---|---|---|
| 1 | none-control | 0 | 1.59 |
| 3* | 1b | 15 | 1.37 |
| 5* | 1d | 15 | 1.28 |
| 9* | 2e | 15 | 1.3 |
| 11 | 5c | 15 | 1.78 |
| 17 | none-control | 0 | 1.53 |
| 18* | 1a | 15 | 1.13 |
| 19 | 4a | 15 | >4.22[1] |
| 20 | none-control | 0 | 1.49 |
| 25 | 3b | 15 | 2.04 |
| 28 | none-control | 0 | 0.53 |
| 29* | 1a | 15 | 0.47 |
| 31* | 1b | 15 | 0.57 |
| 38 | none-control | 0 | 1.7 |
| 40* | 1a | 10 | 1.1 |
| 41* | 1a | 15 | 0.81 |
| 44* | 1a | 30 | 0.35 |

*SAMPLES OF THE PRESENT INVENTION.
[1]sample did not reach equilibrium

From these data it can be concluded that the non-functional cyclophosphazenes (Samples 3, 5, 9, 18, 29, 31, 34, 35 and 40) do not have a negative impact on the moisture pick up of the neat resin or composite samples. In most cases, the non-functional cyclophosphazene flame retardants reduced the moisture pickup of the resin. Moreover, the data show that the ring functional amino cyclophosphazenes such as structures 3a, 3b, 4a and 4b are not beneficial in the resin network since these structures promote moisture pickup. The observation that sample 19 did not reach equilibrium after 30 days is indicative that chemical hydrolysis of the flame retardant may be occurring.

EXAMPLE 14

Effect of Flame Retardant (FR) on Resin Viscosity

In order for a resin comprising flame retardant to be useful in processing techniques such as resin transfer molding (RTM), the viscosity of the resin must be essentially unaffected by the incorporation of the flame retardant. In addition, the flame retardant preferably has a minimal effect on the cure kinetics of the resin and does not cause the resin to cure prematurely. For example, it would be undesirable for the flame retardant to initiate the resin cure while it is being injected into the mold.

One means of assessing resin processibility is obtained from measurement of the change in the resin viscosity as a function of time at a fixed temperature. In this experiment, samples were ramped from 25° C. to 104° C. at 5° C./min. The samples were then held isothermally at 104° C. for 12 hours. The viscosity was measured throughout the experiment. The samples tested were:

(A) Sample 1, PR 500 unmodified, containing no flame retardant;

(B) Sample 2, PR 500 with 15% hexaphenoxy cyclotriphosphazene (Formulae 1, Structure 1a);

(C) Sample 10, PR 500 containing 15% of tris(phenoxy), tris(4-aminophenoxy)cyclotriphosphazene (Formaule 5, Structure 5a); and (D) Sample 11, PR 500 containing 15% tris(phenoxy) tris(4-hydroxyphenoxy)cyclotriphosphazene (Formulae 5, Structure 5c).

Viscosity data were collected using a Rheometrics RDA-II™. The neat, degassed uncured resin samples were cast between two 25 mm parallel plates. A strain amplitude of 2% and a frequency of 100 rad/sec were used. Viscosity data are provided in tabular form in Table 13 and plotted in FIG. 1.

TABLE 13

Viscosity (poise) versus Time (minutes)

| Time (min) | Viscosity A | Viscosity B | Time (min) | Viscosity C | Viscosity D |
|---|---|---|---|---|---|
| 0.1 | 3.39E+03 | 1.97E+03 | 0.1 | 6.51E+04 | 6.51E+04 |
| 5.1 | 1.55E+02 | 3.15E+01 | 6.0 | 2.79E+02 | 1.73E+02 |
| 10.1 | 6.15E+00 | 2.53E+00 | 12.0 | 1.12E+01 | 6.24E+01 |
| 15.1 | 1.07E+00 | 4.94E−01 | 21.0 | 4.02E+00 | 3.00E+00 |
| 20.1 | 6.31E−01 | 4.14E−01 | 30.0 | 4.80E+00 | 7.61E+00 |
| 25.1 | 6.73E−01 | 4.14E−01 | 39.0 | 5.82E+00 | 2.24E+01 |
| 30.2 | 6.86E−01 | 4.39E−01 | 51.1 | 7.69E+00 | 1.30E+02 |
| 50.2 | 7.37E−01 | 4.21E−01 | 102.1 | 3.61E+01 | 6.91E+04 |
| 101.2 | 7.98E−01 | 4.84E−01 | 120.1 | 6.98E+01 | 9348E+04 |
| 203.2 | 9.17E−01 | 4.73E−01 | 150.1 | 2.20E+02 | 9.48E+04 |
| 305.2 | 9.90E−01 | 5.27E−01 | 201.1 | 1.56E+03 | 9.16E+04 |
| 407.2 | 1.17E+00 | 4.96E−01 | 219.1 | 3.25E+03 | 9.12E+04 |
| 509.2 | 1.48E+00 | 5.62E−01 | 261.1 | 1.49E+04 | 9.12E+04 |
| 611.2 | 2.23E+00 | 5.47E−01 | 282.1 | 2.73E+04 | 9.15E+04 |
| 696.2 | 3.56E+00 | 6.68E−01 | 300.1 | 4.20E+04 | 9.08E+04 |
| 730.2 | 4.61E+00 | 7.32E−01 | 399.1 | 9.70E+04 | 9.15E+04 |
|  |  |  | 450.1 | 9.87E+04 | 9.14E+04 |
|  |  |  | 501.1 | 9.90E+04 | 9.16E+04 |
|  |  |  | 549.1 | 9.92E+04 | 9.21E+04 |
|  |  |  | 600.1 | 9.90E+04 | 9.25E+04 |
|  |  |  | 651.1 | 9.92E+04 | 9.26E+04 |

EXAMPLE 15

Comparative Examples

In this experiment, the properties of melt processability, compatibility, moisture pickup (% water), glass transition temperature ($T_g$) and thermal stability were determined for the following samples:

Sample 1: PR 500 with no flame retardant;

Sample 2: PR 500 modified with 15% hexaphenoxycyclotriphosphazene (Formula 1, Structure 1;a);

Sample 4: PR 500 modified with 15% hexa(2-chlorophenoxy)cyclotriphosphazene (Formula 1, Structure 1c);

Sample 13: PR 500 modified with 15% 1,1 bis(3-methoxyphenoxy)-3,5 bis(2,2'-oxybiphenyl) cyclotriphosphazene (Formula 6, Structure 6a, Sample 13)

Sample 14: PR 500 modified with 15% Hostaflam™ TPAP-750™, polyammonium phosphate available from Hoechst-Celanese (Sample 14)

Sample 15: PR 500 modified with 15% Kronitex™-3600, alkyl-aryl phosphate ester, available from FMC Corp; and Sample 16: Brominated epoxy sample.

Compatibility was determined by visually inspecting the cured samples for phase separation. Melt processability was determined by the ability of the flame retardant to dissolve into the resin prior to cure. $T_g$ was determined by differential scanning colorimetry (DSC) using a TA 912™ at a heating rate of 15° C./min from 50° C. to 250° C. Thermal stability and moisture pickup were determined as described previously in Examples 10 and 13 respectively.

TABLE 14

Comparative Data

| Sample | FR Structure | Melt Processable | Compatible | Tg (°C.) (DSC) | % water pickup | wt. loss 200° C. (%) | wt loss 260° (%) | wt loss 300° (%) |
|---|---|---|---|---|---|---|---|---|
| 1 | none-control | yes | — | 201 | 1.59 | <.5 | 1.00 | 2.10 |
| 2* | 1a | yes | yes | 153 | 1.35 | <.5 | 2.10 | 4.50 |
| 4* | 1c | yes | yes | 167 | 1.31 | <.5 | 1.10 | 2.20 |
| 13* | 6b | yes | yes | 173 | 1.25 | <.5 | 1.10 | 3 |
| 14 | Hostaflam ™ TPAP 750 | no | no | 204 | >4.0 | <1 | 1.20 | 2.80 |
| 15 | Kronitex ™ 3600 | yes | yes | 124 | 1.44 | 1.40 | 4.5 | 8 |
| 16 | Br Epoxy | yes | yes | 207 | 1.1 | 0.50 | 0.90 | 40 |

*SAMPLES OF THE PRESENT INVENTION

As can be seen from these comparative examples, the flame retardant in samples 14, 15, 16 had deleterious effects on several critical properties of the thermoset. For example, the particulate flame retardant (Sample 14) was not melt processable and was not compatible in the resin. Moreover, the moisture pick up of this resin was exceedingly high, not reaching equilibrium after 20 days at 82° C. and 100% RH. Additionally, it was found that Sample 14 lost 7% of its initial weight after 46 days at 82° C. and 100% R.H. This suggests that the ammonium phosphate undergoes hydrolysis and degrades the network.

The alkyl-aryl phosphate, Sample 15, reduced the $T_g$ of the resin to such an extent that such a network would not be useful at high temperatures. Additionally, Sample 15 exhibited poor thermal stability losing significant weight at 260° and 300° C.

The brominated epoxy, Sample 16, suffered catastrophic thermal degradation at 300° C. losing 40% of its weight and exhibiting significant off-gassing. Moreover, this material contains bromine which is considered to be environmentally unfriendly.

Flame retardant analyses were conducted as described in Example 12, and results are reported in Table 15.

TABLE 15

Comparative Vertical Burn Data

| Sample | FR Structure | 1st FA (sec) | 2nd FA (sec) | 3rd FA (sec) |
|---|---|---|---|---|
| 1 | none-control | 28 | N/A | N/A |
| 2* | 1a | dni | dni | 51 |
| 4* | 1c | dni | 3 | N/A |

TABLE 15-continued

Comparative Vertical Burn Data

| Sample | FR Structure | 1st FA (sec) | 2nd FA (sec) | 3rd FA (sec) |
|---|---|---|---|---|
| 13* | 6a | dni | dni | 7180 |
| 14 | Hostaflam ™ TPAP 750 | dni | 4 | N/A |
| 15 | Kronitex ™ 3600 | dni | 8 | N/A |
| 16 | Br Epoxy | dni | dni | 60 |

*SAMPLES OF THE PRESENT INVENTION

As can be seen from the Table 15, only the brominated flame retardant, Sample 16, was able to impart similar flame retardant performance as the non-functional cyclophosphazenes. The data in both Tables 14 and 15 show that the non-functional cyclophosphazenes imparts flame retardancy to thermoset networks while not detracting from other critical processing or performance properties.

EXAMPLE 16

Comparison of Alkoxy Cyclophosphazenes to Aryloxy Cyclophosphazenes as Flame Retardants in Epoxy Thermosets The use of non-functional alkoxy cyclophosphazenes as flame retardant additives for thermoset systems is described in Japanese Kokai Patent Application No. SHO 61[1986]-120850. As will be demonstrated in this example, the alkoxy cyclophosphazenes, as compared to the aryloxy cyclophosphazenes, are not suitable flame retardants for thermosettable resins. In this example, the following samples were tested:

Sample 2: PR 500 modified with 15% of hexaphenoxycyclotriphosphazene (Formula 1, Structure 1a);

Sample 6: PR 500 modified with 15% hexa(ethoxy) cyclotriphosphazene (Formula 2, Structure 2a);

Sample 7: PR 500 modified with 15% hexa(n-propoxy) cyclotriphosphazene (Formula 2, Structure 2b); and Sample 8: PR 500 modified with 15% hexa (isopropoxycyclotriphosphazene) (Formula 2, Structure 2c).

The resins were prepared as described in Example 2 and were cured at 177° C. for 4 hours. After curing, it was noted that samples 6 and 8 were porous. Porosity in cured thermoset systems suggests a significant amount of volatile species were evolved during the curing of the resin. Such a resin is unsuitable for any thermoset application as the voids in the resin weaken the structure. The resins were analyzed for $T_g$ (using the procedure described in Example 15), Moisture pick up (using the method described in Example 13), and weight loss (using the method described in Example 10). Values are reported in Table 16.

TABLE 16

Comparative Data

| Sample | Tg (°C.) (DSC) | Moisture Pickup | wt loss @ 220° C. (%) | wt loss @ 260° C. (%) | wt loss @ 300° C. (%) |
|---|---|---|---|---|---|
| 2* | 154 | 1.38 | <1 | 2.4 | 4.5 |
| 6 | 200 | >4.5 | <1 | 1.4 | 6.3 |
| 7 | 166 | >4.2 | 1.1 | 3.3 | 7.3 |
| 8 | 175 | >5.0 | 1.5 | 5.5 | 10.4 |

*SAMPLE OF THE PRESENT INVENTION

From these data it can be concluded that the alkoxy phosphazenes (Samples 6, 7, and 8) do not have the thermal or moisture stability to be considered useful as flame retardants in thermosets. The moisture pickup studies showed that the alkoxy cyclotriphosphazenes (Samples 6, 7, and 8) did not reach equilibrium moisture pick up after 30 days at 82° C. and 100% relative humidity. This suggests that the alkoxy cyclotriphosphazenes do not exhibit adequate hydrolytic stability to be useful in thermoset materials.

EXAMPLE 17

Thermal Equilibration Studies of Alkoxy Cyclophosphazenes Verses Aryloxy Cyclophosphazenes To further substantiate the thermal stability differences of the non-functional aryloxy cyclophosphazenes compared to non-functional alkoxy cyclophosphazenes, neat samples (approximately 1.5 g) of ([NP(OC$_6$H$_5$)$_2$]$_3$ (Formula 1, Structure 1a), ([NP(OC$_2$H$_5$)$_2$]$_3$, (Formula 2, Structure 2a) ([NP(O$^n$C$_3$H$_7$)$_2$]$_3$ (Formula 2, Structure 2b), ([NP(O$^i$C$_3$H$_7$)$_2$]$_3$, (Formula 2, Structure 2c) and N$_3$P$_3$(OC$_6$H$_5$)$_2$(OCH$_2$CF$_3$)$_4$, (Formula 2, Structure 2e) were placed in heavy walled glass tubes and evacuated to 0.25 mm Hg for 30 minutes. The tubes were sealed under vacuum and place in an oven at 200° C. (±5° C.) for 8 hours. After this time, the tubes were allowed to cool to room temperature and opened. The contents of each tube were evaluated by $^{31}$P and $^1$H NMR spectroscopy. By NMR analyses it was found that hexaphenoxycyclotriphosphazene ([NP(OC$_6$H$_5$)$_2$]$_3$ (Formula. 1, Structure 1a), and N$_3$P$_3$(OC$_6$H$_5$)$_2$(OCH$_2$CF$_3$)$_4$, (Formula 2, Structure 2c) did not undergo any chemical equilibration and were unchanged by this thermal process. Hexa(ethoxy) and Hexa(propoxy) cyclotriphosphazene, ([NP(OC$_2$H$_5$)$_2$]$_3$, (Formula 2, Structure 2a) and ([NP(O$^n$C$_3$H$_7$)$_2$]$_3$, (Formula 2, Structure 2b), underwent significant chemical equilibration and decomposition to higher cyclic species or other rearranged products. Moreover, the tube containing hexa(isopropoxy)cyclotriphosphazene (See Formula 2, Structure 2c) detonated during this thermal treatment suggesting a rapid thermal decomposition to volatile species that exceeded the pressure limits of the sealed tube.

From these experiments, it was concluded that the non-functional alkoxy cyclophosphazenes do not have the thermal stability to be useful as flame retardants in these thermosets.

EXAMPLE 18

Thermal Stability Studies of Alkoxy Cyclophosphazenes Verses Aryloxy Cyclophosphazenes using Thermogravimetric Analysis (TGA)

In this analysis, neat samples of the cyclophosphazenes 1a, 2a, 2b, 2c, and 2e were analyzed by thermogravimetric analysis (TGA). The samples were held for two hours at 200° C., during which time the weight loss of each sample was measured at intervals of 10, 20, 30, 60 and 120 minutes. From these experiments it could be determined if volatility and/or decomposition of the cyclophosphazenes at a typical processing temperature of 200° C. were likely to be problematic. The weight loss data are listed in below in Table 17.

TABLE 17

TGA Weight Loss Data for Alkoxy and Aryloxy Cyclophosphazenes Held at 200° C.

| FR Structure (see FIG. 1-2) | Wt. loss @ 10 min | wt. loss @ 20 min | wt loss @ 30 min | wt loss @ 60 min | wt loss @ 120 min |
|---|---|---|---|---|---|
| 1a* | 0.2 | 1.2 | 1.4 | 1.6 | 1.8 |
| 2a | 8.1 | 81 | 98 | 99 | >99 |
| 2b | 4.2 | 23 | 41 | 81 | 99 |
| 2c | 16 | 75 | 98 | >99 | >99 |
| 2e* | 12.2 | 45.3 | 59.4 | 80.1 | 95.6 |

*SAMPLES OF THE PRESENT INVENTION

From these data, it was concluded that the alkoxy cyclophosphazenes (Structures 2a, 2b, 2c and 2e) would not be beneficial in thermoset resins that are used or processed at elevated temperatures since the decomposition and/or volatility of the flame retardant at these temperatures would be problematic. These data also show that the alkoxy containing cyclophosphazenes possess inherent drawbacks that would limit their utility as flame retardant additives in thermosettable materials.

EXAMPLE 19

Dielectric Constants of Thermosetting Resins

Relative permittivity (dielectric constant) and dissipation factor (loss tangent) were determined for thermoset resins using ASTM D150 Micrometer Electrodes at frequencies of 1 KHz and 1 MHz. Rolled-on foil was used for the measurements of dielectric constant, while no foil was used for measurements of loss tangent. Data are listed in Table 18.

TABLE 18

Effect of Flame Retardant on Dielectric Constant

| Sample | Resin | Flame Retardant | Frequency | Dielectric Constant | Loss Tangent | Loss Index |
|---|---|---|---|---|---|---|
| 1 | PR500 | Control | 1 KHz | 4.123 | 0.002 | 0.01 |
| 4* | PR500 | 1c | 1 KHz | 3.934 | 0.005 | 0.019 |
| 17 | FEP-CAF | Control | 1 KHz | 3.885 | 0.0054 | — |
| 18* | FEP-CAF | 1a | 1 KHz | 3.71 | 0.0061 | — |
| 51[1] | AroCy B10 | Control | 1 KHz | 3.077 | 0.0084 | — |
| 52*[1] | AroCy B10 | 1a | 1 KHz | 3.059 | 0.0078 | — |
| 1 | PR500 | Control | 1 MHz | 3.858 | 0.028 | 0.101 |
| 4* | PR500 | 1c | 1 MHz | 3.804 | 0.021 | 0.077 |
| 17 | FEP-CAF | Control | 1 MHz | 3.65 | 0.0272 | — |
| 18* | FEP-CAF | 1a | 1 MHz | 3.516 | 0.0217 | — |
| 51[1] | AroCy B10 | Control | 1 MHz | 2.946 | 0.0107 | — |
| 52*[1] | AroCy B10 | 1a | 1 MHz | 2.921 | 0.0094 | — |

*SAMPLES OF THE PRESENT INVENTION
[1]Samples 51 and 52 were prepared using the same procedures as for Samples 38 and 41, respectively, except that AroCy ™ B10 cyanate ester from Ciba-Geigy was used in place of AroCy ™ B30.

From these data it is apparent that the non-functional cyclophosphazene flame retardant additives do not negatively impact the dielectric performance of the epoxy or cyanate ester thermoset resins.

EXAMPLE 20

Aryloxy Cyclophosphazene Flame Retardants with Retention of the Resin $T_g$

The incorporation of the non-functional aryloxy cyclophosphazene flame retardant of the type shown in FIG. 1, Structure 1a, results in about a 20% decrease in the $T_g$ of the PR 500 resin. In most cases, this reduction in $T_g$ is still within acceptable limits. However, it was found that other cyclophosphazene structures would prevent this type of $T_g$ reduction. The $T_g$ of the PR 500 resin can be maintained by incorporation of either an incompatible aryloxy cyclophosphazene of the types shown in FIG. 1 as Structures 1b or 1e, or aryloxy bicyclophosphazenes of the types shown in Formula 6 as Structures 6a or 6b, or by blending aryloxy cyclophosphazenes of the types shown in FIG. 1 as Structures 1a and 1e. These affects on $T_g$ are summarized in Table 19. $T_g$ was measured as in Example 2. The term "compatibility" used in Table 19 refers to the visual detection of non-homogeneity after the sample was cured.

TABLE 19

Impact of Non-functional Aryloxy Cyclophosphazenes on $T_g$ of PR 500 Resin Systems

| Sample | FR Structure | Wt % FR | Compatibility | $T_g$ (°C., TMA) | % $T_g$ Loss |
|---|---|---|---|---|---|
| 1 | none-control | 0 | n/a | 196 | 0.0 |
| 2* | 1a | 15 | yes | 153 | −21.9 |
| 3* | 1b | 15 | no | 182 | −7.1 |
| 9* | 2e | 15 | no | 191 | −2.6 |
| 12* | 6a | 15 | yes | 174 | −11.2 |
| 13* | 6b | 15 | yes | 173 | −11.7 |
| blend 1a/1e[1]* | 1a/1e | 15 | no | 173 | −11.7 |

[1]Sample was prepared as described for other PR 500 resin formulations (see Example 2). However, the flame retardant (FR) consisted of an equal weight mixture of the non-functional aryloxy cyclophosphazene flame retardants 1a and 1e such that the total percent of the FR mixture equaled 15 percent of the total weight of the formulation.
*Samples of the present invention.

From these data it can be seen that the $T_g$ of the resin can be maintained by selecting a cyclophosphazene structure that can phase separate after the cure. Alternatively, a rigid non-functional cyclophosphazene such as bicyclophosphazenes of the type given in FIG. 6 may be used to preserve the $T_g$ of the resin.

EXAMPLE 21

Use of Inert Cyclophosphazenes in a Two-Component Epoxy Structural Adhesive

A two-component epoxy structural adhesive was prepared with and without a non-functional cyclophosphazene flame retardant. Adhesives consisted of a base component and a curative component as shown in Table 20 in parts by weight.

TABLE 20

Two Component Structural Adhesive Formulations

|  | Sample 53 | Sample 54 |
|---|---|---|
| ADHESIVE BASE | | |
| EPON™ 828 Epoxy | 99 | 99 |
| Glycidoxypropyl- | 1 | 1 |
| Trimethoxysilane | | |
| Hexaphenoxycyclohosphazene (Formula 1, Structure 1a) | — | 15 |
| ADHESIVE CURATIVE | | |
| Henkel Capcure ™ 3-800 | 83 | 83 |
| Henkel Capcure ™ 40HV | 17 | 17 |
| Hexaphenoxycyclophosphazene (FIG. 1, Structure 1a) | — | 15 |

The adhesive base portion of the composition was prepared by mixing the indicated amount of the crystalline solid cyclophosphazene with the liquid EPON™ 828 epoxy resin. The mixed materials were then heated to approximately 120° C. in a glass jar until the cyclophosphazene was completely liquefied. The hot mixture was agitated by swirling the jar until the cyclophosphazene and epoxy resin mixture became homogeneous. Other components of the adhesive base, if any, were added to the cyclophosphazene-epoxy blend after it had cooled to room temperature. Similarly, the adhesive curative was made by melt-mixing the cyclophosphazene and mercaptan curative components listed in Table 20 at 120° C., then allowing the mixture to cool to room temperature.

The base and curative compositions were mixed 1:1 by volume and dispensed simultaneously using a 3M Duo-Pak™ dual syringe and static mixer combination. Three rectangular plaques having dimensions 5.0"L×1.0"W× 0.125" (12.5 cm×2.5 cm×0.31 cm) of each adhesive formulation (Samples 53 and 54) were obtained by dispensing the mixed adhesive into cavity molds milled from polytetrafluoroethylene (PTFE) and allowing a 7-day cure in ambient laboratory conditions before testing. Burn testing was done by suspending the plaques in a horizontal position within a steel frame on three evenly spaced 0.020" (0.508 mm) thick steel wires. Burn tests were conducted in a laboratory hood with the sash closed and fan off to minimize stray drafts. The burner flame height was set by adjusting the natural gas flame with burner air inlets closed to get a 1.0" (2.5 cm) height yellow flame, then opening the air inlets until a blue flame of the same height was obtained. The burner flame was applied to one end of the test specimen for 10 seconds, then withdrawn. The time of burning after removal of the flame, the qualitative intensity of the flame from the burning adhesive, and the time required for the flame front to travel 1.0" (2.5 cm) from the end of the plaque were recorded. Samples were allowed to burn for a maximum of 90 seconds, if they did not self-extinguish. Horizontal burn tests were run in triplicate for each sample, and the results are reported in Table 21.

TABLE 21

Horizontal Burn Test Results

| Sample | Burn Time | Intensity | Time to Burn 1.0" |
|---|---|---|---|
| 53 | Did not self extinguish** | High | 60 s |
| 53 | Did not self extinguish** | High | 90 s |
| 53 | Did not self extinguish** | High | 55 s |

TABLE 21-continued

Horizontal Burn Test Results

| Sample | Burn Time | Intensity | Time to Burn 1.0" |
|---|---|---|---|
| 54* | Self-extinguished @ 50 seconds | Low | NA, Burned <0.125" (0.32 cm) |
| 54* | Self-extinguished @ 60 seconds | Low | NA, Burned <0.125" (0.32 cm) |
| 54* | Self-extinguished @ 54 seconds | Low | NA, Burned <0.125" (0.32 cm) |

*Samples of the present invention.
**Samples were extinguished with water at 90 seconds because they were filling the laboratory hood with smoke and soot.
NA = not applicable as sample did not burn 1.0".

The horizontal burn test results given in Table 21 illustrate that the addition of a non-functional cyclophosphazene imparts flame retardancy to a two-component epoxy structural adhesive.

The same formulations as given in Table 20, except for the replacement of 1 part of glycidoxypropyltrimethoxysilane with 1 part of EPON™ 828 epoxy resin were used for lap shear and peel testing. These formulations are identified in Table 22 as Samples 55 and 56. Lap shear specimens were prepared by spreading each mixed epoxy composition (prepared using the same procedure described above) onto an acetone-wiped, 0.60" (1.5 cm) thick, 1"×4"×(2.5×10.2 cm) aluminum alloy coupon (Alcoa 6111). Bond thickness was controlled by mixing approximately 1 wt % glass beads of nominal 0.010" (0.025 cm) diameter with the adhesive before application. After approximately 18 hours at room temperature, the bonds received a 30 minute post-cure at 250° F. (120° C.). After cooling to room temperature, the bonds were tested for Lap Shear Strength according to ASTM D1002-72 on an Instron tensile tester at a crosshead speed of 0.5" per minute (0.125 cm/min). Results are given in Table 22 as an average of the number of specimens indicated.

TABLE 22

Average Lap Shear Values of Epoxy Adhesives

| Sample | Avg. Lap Shear Values | # of Specimens |
|---|---|---|
| 55 | 1996 psi (13.8 MPa) | 3 |
| 56* | 2126 psi (14.7 MPa) | 4 |

*Sample of the present invention.

The lap shear results of Sample 55 (no flame retardant) and Sample 56 indicate that addition of the cyclophosphazene flame retardant has essentially no effect on the initial adhesive shear strength.

T-peel specimens were prepared using 8.0"L×1.0"W ×0.042"T (20.3 cm×2.5 cm×0.11 cm) aluminum alloy (Alcoa 2008-T4) strips which were acetone-wiped before use. The adhesive was mixed and applied to approximately 6" (15.2 cm) of the coupon. Bond thickness was controlled by mixing approximately 1 wt % glass beads of nominal 0.010" (0.25 mm) diameter with the adhesive before application. The adhesive sides of two adhesive-bearing strips were then clamped together with binder clips for approximately 18 hours at room temperature. After this, the bonds received a 30 minute post-cure at 250° F. (120° C.) and were tested after cooling to room temperature. Bonds were tested according to ASTM D1876-72 on an Instron tensile tester at a crosshead speed of 10.0" per minute (25.4 cm/min). The recorded value in Table 23 is the average sustained peel load for the number of specimens indicated in the table.

TABLE 23

Average Peel Values for Epoxy Adhesives

| Sample | Avg. Peel Value | # of Specimens | Notes |
|---|---|---|---|
| 55 | 14 lbs/in width (24.5 N/cm) | 4 | Brittle Failure |
| 56* | 48.3 lbs/in width (84.5 N/cm) | 3 | Ductile Failure |

*Sample of the present invention.

Brittle failure means that the adhesive exhibited sudden catastrophic fractures within the resin during the peel test. Ductile failure means that the adhesive exhibited a continuous, yielding fracture of the resin during the peel test. In general, ductile failure of structural adhesives in the peel or cleavage mode is the preferred failure mode, and may be interpreted as a measure of the fracture toughness of the adhesive. As may be seen from the results in Table 23, the peel strength and failure mode of the adhesive are both improved by the addition of the cyclophosphazene flame retardant. Furthermore, there was no visible evidence on the specimens of migration of the non-functional flame retardant out of the epoxy matrix.

EXAMPLE #22

Use of Inert Cyclophosphazene in Combination With a Flame Retardant Synergist Heat-curable epoxy compositions 57, 58, 59, 60 and 61 were prepared to evaluate additive or synergistic effects of a non-functional cyclophosphazene flame retardant combined with other nonhalogenated flame retardants and halogen-free curative. Compositions were prepared with and without a cyclophosphazene-synergist combination and evaluated for flame retardant behavior.

Composition 57 comprised an epoxy resin (EPON™ 828) having cyclophosphazene flame retardant (Formula 1, structure 1a) with no other additional flame retardants. Composition 58 comprised the same components as Composition 57 with the further addition of Araldite™ PT 810 epoxy resin described previously in Example 7. Composition 59 comprised the same components as Composition 57 except for the addition of particulate melamine isocyanurate (available from Aldrich Chemical) flame retardant and the omission of fumed silica to counter the viscosity increase imparted by the particulate melamine isocyanurate. Compositions 60 and 61 comprised the same components as Composition 57 except for the further addition of AroCy™ L10 cyanate ester and the omission of fumed silica. The formulations employed are listed in Table 24 with quantities given as parts by weight.

TABLE 24

Epoxy Formulations Modified
With Cyclophosphazene Flame Retardants and Synergists

| | Composition | | | | |
|---|---|---|---|---|---|
| | 57* | 58* | 58* | 60* | 61* |
| EPON ™ 828 Epoxy | 50 | 40 | 50 | 40 | 40 |
| PT-810 Epoxy Resin | 0 | 10 | 0 | 0 | 0 |
| Melamine Isocyanurate | 0 | 0 | 10 | 0 | 0 |
| OTBAF | 37.7 | 44.0 | 37.7 | 30.1 | 30.1 |
| Cyclophosphazene | 16.0 | 17.1 | 18.9 | 16.7 | 16.7 |
| Fumed Silica | 3.0 | 3.0 | 0 | 0 | 0 |
| Cyanate Ester (Solid) | 0 | 0 | 0 | 0 | 9.4 |
| Cyanate Ester (Liq) | 0 | 0 | 0 | 9.4 | 0 |

*Samples of the present invention.

Composition 57 was prepared by mixing the indicated amount of the crystalline solid cyclophosphazene (Formula 1, Structure 1a) with the liquid EPON™ 828 epoxy resin. The mixture was heated to 120° C. and agitated until all the cyclophosphazene was completely liquified and the mixture became homogeneous. Particulate components [OTBAF (described in Example 7) and fumed silica] were then added to the hot resin-flame retardant mixture and dispersed with stirring.

Composition 58 was prepared by grinding the solid epoxy resin Araldite™ PT 810 into a fine powder and melt-mixing it with the EPON™ 828 resin at about 120° C. Crystalline solid cyclophosphazene (Formula 1, Structure 1a) was then added to the melt. The mixture was held at 120° C. with agitation until the cyclophosphazene was completely liquified and the mixture became homogeneous. Particulate components, OTBAF and fumed silica, were added to the hot resin-flame retardant mixture and dispersed with stirring.

Composition 59 was prepared using the same procedure described above for Composition 57 except that (1) finely ground melamine isocyanurate particulate was added to the hot resin-cyclophosphazene blend with the OTBAF and dispersed with stirring and (2) fumed silica was omitted from the formulation.

Composition 60 was prepared using the same procedure described above for Composition 57 except that liquid AroCy™ L10 cyanate ester was added to the EPON™ 828 epoxy resin at room temperature prior to the addition of the cyclophosphazene. Fumed silica was again omitted from this formulation.

Composition 61 was prepared according to the same procedure described above for Composition 57 except that cured cyanate ester particles were added to the hot resin-cyclophosphazene blend with the OTBAF and dispersed with stirring and (2) fumed silica was omitted from the formulation. The cyanate ester particles were prepared by pre-curing uncatalyzed AroCy™ L10 cyanate ester at 190° C. for 72 hours. The solidified cyanate ester resin was then hammer-milled to an average particle size of 10 microns.

Rectangular plaques of dimensions 12.5 cm L×2.5cm W×0.31 cm T were obtained by curing each of the compositions in cavity molds milled from PTFE. The cure cycle consisted of a 30 minute hold at 70° C. followed by ramp to 180° C. at 1° C. /minute, followed by a two hour hold at 180° C. Burn testing was then done with the de-molded plaques clamped in a vertical position. Burn tests were conducted in a laboratory hood with sash closed and fan off to minimize stray drafts.

The burner flame height was set by adjusting the natural gas flame with the burner air inlets closed to get a 2.5 cm height yellow flame, then opening the air inlets until a blue flame of the same height was obtained. The burner flame was applied to one end of the test specimen for 10 seconds, then withdrawn. The time of burning after removal of the flame was noted. A second 10 second application was made after the sample self-extinguished, and burn time after removal of the flame was again noted. Results of the vertical burn tests of these formulations are summarized in Table 25; two tests were run per formulation.

TABLE 25

Vertical Burn Test Results

| | Burn times | |
|---|---|---|
| Sample | First Application (seconds) | Second Application (seconds) |
| 57* | 1 | Burned to Completion |
| | 3 | Burned to Completion |
| 58* | 3 | 3 |
| | 1 | 6 |
| 59* | 2 | 5 |
| | 2 | 5 |
| 60* | 1 | 1 |
| | 1 | 3 |
| 61* | 1 | 8 |
| | 4 | 3 |

*Samples of the present invention.

The results in Table 25 show that the use of either Araldite™ PT810, melamine cyanurate or cyanate ester with cyclophosphazene flame retardant improves the flame retardancy of the epoxy composition. This is especially apparent in the data reported for the second flame application where markedly improved results are given for the formulations comprising both cyclophosphazene with either Araldite™ PT810, melamine cyanurate, or cyanate ester.

The results also show that cyanate ester may be added to the epoxy resin system as a cured resin or as an uncured resin, and in either case, functions as a synergist with the cyclophosphazene flame retardant in the cured thermoset system.

We claim:

1. A thermosettable composition comprising:
   (a) one or more thermosettable resins selected from the group consisting of N,N'-bismaleimide and cyanate ester monomers and prepolymers,
   (b) an effective amount of one or more of curatives, hardeners, and optionally catalysts for the curing of the thermosettable resins and
   (c) an effective amount of at least one non-functional cyclophosphazene flame retardant to render said resin composition, when cured, flame retardant, wherein said non-functional cyclophosphazene contains aryloxy group substitution.

2. A thermosettable composition according to claim 1 comprising 100 parts by weight of said resin and from about 3 to about 50 parts by weight of said non-functional cyclophosphazene.

3. A thermosettable composition according to claim 1 comprising 100 parts by weight of said resin and from about 3 to about 40 parts by weight of said non-functional cyclophosphazene.

4. A thermosettable composition according to claim 1, wherein the amount of said aryloxy group substitution is greater than 50%.

5. A thermosettable composition according to claim 1, wherein said aryloxy group substitution is 100%.

6. A thermosettable composition according to claim 2, wherein the amount of said aryloxy group substitution is greater than 50%.

7. A thermosettable composition according to claim 4, wherein said cyclophosphazene comprises mixed substituent aryloxy group substitution.

8. A thermosettable composition according to claim 1, wherein said thermosettable composition comprises a physical blend of at least two non-functional cyclophosphazenes.

9. A thermosettable composition according to claim 8, wherein said at least two non-functional cyclophosphazenes comprise 100% aryloxy group substitution.

10. The thermosettable composition of claim 1 wherein the non-functional cyclophosphazene has the general formula:

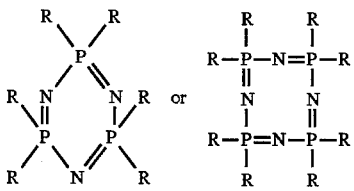

wherein:

R is selected from the group consisting of:

$R^1$, $XR^1$ and $—OCH_2R_f$, wherein:

$R^1$ is selected from the group consisting of linear or branched alkyl having one to twelve carbon atoms; cycloalkyl having five to six carbon atoms; and unsubstituted and substituted aryl, X is selected from the group consisting of oxygen, sulfur, and $NR^2$;

wherein $R^2$ is an alkyl having one to four carbon atoms, and further wherein when X is oxygen, two $R^1$ groups may be covalently bonded to form a divalent group that is selected from the group consisting of 1,8-naphthalenediyl, 4,5-naphthalenediyl and 2,2'-biphenylene; and $R_f$ is a polyfluoroaliphatic group having 2 to 20 carbon atoms and up to 5 ether oxygen atoms, with the proviso that no more than three R groups comprise (a) $R^1$ or (b) $XR^1$ where X is oxygen and $R^1$ is linear or branched alkyl.

11. A thermosettable composition according to claim 1, wherein said thermosettable resin further comprises additional flame retardant.

12. A thermosettable composition according to claim 1 that is cured.

13. A prepreg comprising reinforcing filaments and the thermosettable composition of claim 1.

14. A thermosettable adhesive comprising the resin of claim 1.

15. A flame retardant article comprising the cured resin of claim 1 formed into an article by means of resin transfer molding.

16. A thermosettable composition according to claim 1 further comprising a synergist.

17. A web impregnated with the thermosettable composition of claim 1.

18. A circuit board comprising the cured thermosettable composition of claim 1.

19. A substrate coated with the cured thermosettable composition of claim 1.

20. A method of rendering a thermosettable composition flame retardant, comprising the steps of:

(a) providing one or more thermosettable resins selected from the group consisting of N,N'-bismaleimide and cyanate ester monomers and prepolymers; an effective amount of one or more of curatives, hardeners, and optionally catalysts for the curing of the one or more thermosettable resins; and an effective amount of at least one non-functional cyclophosphazene flame retardant containing aryloxy group substitution to render said resin flame retardant;

(b) combining the one or more thermosettable resins, curatives, hardeners and optionally catalysts, and the at least one non-functional cyclophosphazene to form a mixture, and (c) curing said mixture.

* * * * *